(12) United States Patent
Ikedo

(10) Patent No.: US 8,345,736 B2
(45) Date of Patent: Jan. 1, 2013

(54) SAMPLING POINT DETECTION CIRCUIT, TRANSMISSION SYSTEM, PRE-EMPHASIS INTENSITY ADJUSTMENT METHOD, LOGIC ANALYZER, AND EVALUATION METHOD FOR EVALUATING TRANSMISSION PATH

(75) Inventor: Kenji Ikedo, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 185 days.

(21) Appl. No.: 12/827,528

(22) Filed: Jun. 30, 2010

(65) Prior Publication Data

US 2011/0002370 A1    Jan. 6, 2011

(30) Foreign Application Priority Data

Jul. 1, 2009   (JP) .................................. 2009-156999

(51) Int. Cl.
*H04B 3/46* (2006.01)
*H04B 17/00* (2006.01)
*H04Q 1/20* (2006.01)

(52) U.S. Cl. ......... 375/225; 375/219; 375/224; 375/316

(58) Field of Classification Search .................. 375/224, 375/225, 219, 316
See application file for complete search history.

(56) References Cited

U.S. PATENT DOCUMENTS

| 7,386,041 | B2* | 6/2008 | Nygaard, Jr. .................. 375/224 |
| 2003/0007222 | A1 | 1/2003 | Kwasaki et al. |
| 2006/0190200 | A1* | 8/2006 | Nygaard, Jr. ..................... 702/68 |
| 2007/0247191 | A1* | 10/2007 | Tanabe ............................ 326/82 |
| 2008/0240291 | A1 | 10/2008 | Tanabe |
| 2010/0070221 | A1* | 3/2010 | Altimus .......................... 702/66 |

FOREIGN PATENT DOCUMENTS

| JP | 01-154660 A | 6/1989 |
| JP | 06-237231 A | 8/1994 |
| JP | 2002-247116 A | 8/2002 |
| JP | 2003-18140 A | 1/2003 |
| JP | 2006-234821 A | 9/2006 |
| JP | 2007-274139 A | 10/2007 |
| JP | 2008-252696 A | 10/2008 |

OTHER PUBLICATIONS

"Jitter Analysis Techniques for High Data Rates", Application Note 1432, Agilent Technologies.
"Basic Knowledge of Jitter and Overview of Measurement Techniques in High Speed Serial Communication", Agilent Technologies, published May 13, 2008.

* cited by examiner

*Primary Examiner* — Ted Wang
(74) *Attorney, Agent, or Firm* — Locke Lord LLP

(57) ABSTRACT

A sampling point detection circuit 1 comprises: means 11 for setting amplitude division lines along a time axis and time division lines along an amplitude axis of an eye diagram; means 12 for calculating a virtual circle that is inscribed in a divided region having the smallest area among divided regions obtained when a region that is defined by segments each connecting intersections of a bit error rate contour line of the eye diagram and the amplitude division line and intersections of the bit error rate contour line and the time division line and that contains an intersection of the amplitude division line and the time division line is divided by the amplitude division line and time division line; and means 13 for determining, as a sampling point, the intersection of the time division line and the amplitude division line that are set when the largest virtual circle among the virtual circles is calculated.

14 Claims, 20 Drawing Sheets

AMPLITUDE DIVISION LINE

P3

TIME DIVISION LINE

AMPLITUDE DIVISION LINE

P4

TIME DIVISION LINE

US 8,345,736 B2

SAMPLING POINT DETECTION CIRCUIT, TRANSMISSION SYSTEM, PRE-EMPHASIS INTENSITY ADJUSTMENT METHOD, LOGIC ANALYZER, AND EVALUATION METHOD FOR EVALUATING TRANSMISSION PATH

BACKGROUND OF THE INVENTION

1. Field of the Invention

The present invention relates to a sampling point detection circuit for detecting a sampling point in an eye diagram, a transmission system comprising the sampling point detection circuit, a pre-emphasis intensity adjustment method using the sampling point detection circuit, a logic analyzer comprising the sampling point detection circuit, and an evaluation method for evaluating transmission characteristics of a digital signal in a transmission path based on an eye diagram of an output signal from an output end of the transmission path when an evaluation signal is input to an input end of the transmission path.

2. Description of the Related Art

As set forth in "Jitter Analysis Techniques for High Data Rates—Application Note 1432", Agilent Technologies, http://cp.literature.agilent.com/litweb/pdf/5988-8425EN.pdf, in a digital transmission path used for high speed serial transmission, signal degradation occurs due to jitter, noise or transmission loss. For this reason, in order to improve communication reliability, a circuit designer adjusts transmission waveforms so as to obtain an optimal sampling point and transmission waveforms at an output end of the transmission path.

FIG. 19 is a diagram illustrating an eye pattern (eye diagram). Typically, in a region satisfying a certain error rate (hereinafter referred to as the "effective region") in an eye diagram (though this is also referred to as the "eye pattern", the term "eye diagram" is used in this patent specification) that is obtained when a pseudo-random data signal is input to a transmission path, a point where error is least likely to occur is found by using any technique and this point is defined as the sampling point.

For example, as set forth in Japanese Unexamined Patent Publication No. 2003-018140, a technique in which an intersection of a voltage level at which a time axis has the largest dimension and a time value at which an amplitude axis has the largest dimension in an effective region in an eye diagram is determined as a sampling point has been proposed.

Further, for example, as set forth in Japanese Unexamined Patent Publication No. 2006-234821, a technique in which squares (or circles) that are centered on respective points and that fit inside an effective region in an eye diagram are drawn with respect to all points in the effective region and the center point of the square (or circle) having the largest area is determined as a sampling point has been proposed.

In addition, in a technique widely used in the conventional art, a center point in the time and amplitude axis directions of an eye opening in an eye diagram is simply determined as a sampling point. (For example, see Japanese Unexamined Patent Publication No. 2007-274139 and Japanese Unexamined Patent Publication No. 2008-252696.)

On the other hand, when an eye opening in an eye diagram is reduced due to transmission loss of a signal received through a transmission path, transmission waveforms are adjusted to maximize the eye opening in the eye diagram by amplifying the signal input to the transmission path using a pre-emphasis circuit. Conventionally, the transmission waveforms are adjusted to maximize the eye opening in the amplitude axis direction (voltage direction) of the received waveforms in the eye diagram.

In contrast to this, for example, as set forth in Japanese Unexamined Patent Publication No. 2007-274139, there is also proposed a technique in which an eye opening in the time axis direction in an eye diagram is observed to adjust transmission waveforms.

Further, for example, as set forth in Japanese Unexamined Patent Publication No. 2008-252696, a technique in which attenuation of a reflected signal from a receiving end is observed to adjust transmission waveforms has been proposed.

On the other hand, as described in "A basic knowledge of jitter and an overview of measurement techniques in high speed serial communication", Agilent Technologies, there is proposed a technique for evaluating quality of a digital signal in a transmission path used for high speed serial transmission. Evaluation parameters of the transmission path in a frequency domain include an S parameter that is calculated from waveforms observed by a TDR (time domain reflectometry)/TDT (time domain transmission) measuring device or measured by a network analyzer. Further, evaluation parameters of the transmission path in a time domain include characteristic impedance obtained from step response waveforms, an eye diagram obtained when a pseudo-random data signal is input to the transmission path, a jitter amount, and a bit error rate (BER).

FIG. 20 is a diagram illustrating an evaluation system that is typically used in the conventional art. In a transmission evaluation system 200, a transmission path 5 to be evaluated is connected to a pulse pattern generator (PPG) 101 and a digital oscilloscope 41 or a bit error rate tester (BERT) 42 via coaxial cables 102. When a pseudo-random data signal that is an evaluation signal generated by pulse pattern generator 101 is input to an input end of transmission path 5, a state of an output signal from an output end of transmission path 5 can be observed as an eye diagram (eye pattern), for example, by using digital oscilloscope 41.

Quality of the transmission path can be evaluated by the degree of openness of the eye in the observed eye diagram. The eye diagram visually displayed on a screen of the digital oscilloscope has an advantage that an observer can intuitively recognize it. However, this eye diagram is not suitable for quantitative evaluation.

For this reason, as set forth in Japanese Unexamined Patent Publication No. 2002-247116, an "eye opening ratio" that quantitatively represents how widely the eye is opened in the eye diagram is determined by calculation and the quality of the transmission path is evaluated based on this eye opening ratio.

FIG. 21 is a diagram for describing calculation of an eye opening ratio that is performed in the conventional art. In this figure, X represents a threshold level. The eye opening ratio is defined by a value in the time axis direction (jitter) and a value in the amplitude axis direction (noise). As illustrated in FIG. 21, in an eye opening in an eye diagram at a specific bit error rate, it is assumed that, on the amplitude axis, a dimension between the maximum and minimum amplitude levels is A and a dimension between the minimum amplitude level higher than X and the maximum amplitude level lower than X is B. Further, it is assumed that, on the time axis, the maximum and minimum dimensions of the eye opening are C and D, respectively. At this time, the eye opening ratio in the time and amplitude axis directions is expressed as follows:

$$\text{Eye opening ratio (time)} = \frac{2 \times D}{C + D}$$

$$\text{Eye opening ratio (amplitude)} = \frac{2 \times B}{A + B}$$

As set forth in Japanese Unexamined Patent Publication No. 06-237231, an apparatus for automating evaluation of quality of a transmission path so as to avoid visual observation using an eye mask that has been performed for this purpose has been proposed. Further, as set forth in Japanese Unexamined Patent Publication No. 01-154660, a circuit for simplifying calculation of an eye opening ratio in an eye diagram has also been proposed.

Actual eye diagrams often have eye openings whose shape is asymmetrical in the amplitude and time axis directions. In this case, in the conventional techniques, the optimal sampling point cannot always be detected.

FIG. 22 is a diagram of detecting of a sampling point when an eye opening in an eye diagram has an asymmetrical shape in the time axis direction. According to the invention as set forth in Japanese Unexamined Patent Publication No. 2003-018140, an intersection of a voltage level at which a time axis has the largest dimension and a time value at which an amplitude axis has the largest dimension in an effective region in an eye diagram is assumed to be an optimal sampling point. Consequently, the sampling point is detected at a point P1. Thus, according to the invention as set forth in Japanese Unexamined Patent Publication No. 2003-018140, a sampling point can be accurately detected in an eye diagram in which an eye opening has a symmetrical shape in the amplitude and time axis directions. However, this technique is not practical because actual eye diagrams often have eye openings whose shape is asymmetrical in the amplitude and time axis directions.

On the other hand, according to the invention as set forth in Japanese Unexamined Patent Publication No. 2006-234821, squares (or circles) that are centered on respective points and that fit inside an effective region are drawn with respect to all points in the effective region in an eye diagram and the center point of the square (or circle) having the largest area is determined as a sampling point. Consequently, a sampling point can be accurately detected at a point P2. However, according to the invention as set forth in Japanese Unexamined Patent Publication No. 2006-234821, the squares (or circles) that are centered on the respective points and that fit inside the effective region have to be obtained with respect to all the points in the effective region in the eye diagram. As a result, this technique requires enormous processing time.

According to the inventions as set forth in Japanese Unexamined Patent Publication No. 2007-274139 and Japanese Unexamined Patent Publication No. 2008-252696, a center point in the time and amplitude axis directions of an eye opening in an eye diagram is simply determined as a sampling point. Consequently, when the eye opening of the eye diagram has a symmetrical shape in the amplitude and time axis directions, the sampling point can be accurately detected. However, when the eye diagram deviates in the time axis direction, the sampling point cannot be accurately detected.

As long as the sampling point cannot be accurately detected, various information processing devices such as a pre-emphasis circuit and a logic analyzer that perform processes with respect to the sampling point cannot accurately operate.

Further, even if different eye diagrams have the same eye opening ratio values, the corresponding transmission paths may not have entirely comparable quality. FIGS. 23A and 23B are diagrams of the evaluation of quality of a transmission path when an eye diagram is gently opened. Though the eye diagrams illustrated in FIGS. 23A and 23B both have an eye opening ratio of 75% in the time axis direction and an eye opening ratio of 75% in the amplitude axis direction, the eye diagram illustrated in FIG. 23B has an area of the eye that is smaller than that illustrated in FIG. 23A. As a result, even though the diagram of both eyes has the same eye opening ratio, it should be understood that the eye diagram illustrated in FIG. 23B has lower quality than that illustrated in FIG. 23A. But, such evaluation cannot be made by using the conventional eye opening ratio values only. The qualitative evaluation like this can be made by visually observing the eye diagram. However, when there are many objects to be evaluated, the visual evaluation like this is time-consuming and inefficient.

Still further, conventionally, in evaluation of a transmission path, a value in the time axis direction that is affected by jitter and a value in the amplitude axis direction that is affected by noise as an eye opening ratio and the values in the time and amplitude axis directions are evaluated independently of each other. However, it is essentially desirable that quality of a digital signal passing through the transmission path is evaluated taking into consideration the effect of both the jitter and the noise.

Still further, in a mask test that tests an eye diagram by using a mask pattern, it can be evaluated only whether the eye diagram has good quality or not. However, the degree or specific details of the quality of the eye diagram cannot be quantitatively evaluated.

In view of the above problems, it is an object of the invention to provide a sampling point detection circuit that can accurately detect a sampling point in an eye diagram, a logic analyzer and a transmission system comprising this sampling point detection circuit, a pre-emphasis intensity adjustment method using this sampling point detection circuit, and an evaluation method for automatically evaluating, by a processor, transmission characteristics of a transmission path based on an eye diagram of an output signal from an output end of the transmission path when an evaluation signal is input to an input end of the transmission path.

SUMMARY OF THE INVENTION

In order to achieve the above object, according to a first aspect of the invention, a sampling point detection circuit for detecting a sampling point in an eye diagram is provided, comprising: division line setting means for successively setting amplitude division lines along a time axis and time division lines along an amplitude axis in a translational manner in time and amplitude axis directions, respectively, on a virtual plane having coordinate axes that are the time and amplitude axes of an eye diagram; virtual circle calculation means for calculating a virtual circle that is inscribed in a divided region having the smallest area among four divided regions obtained when a region that is defined by segments each connecting intersections of a bit error rate contour line of the input eye diagram and the amplitude division line set by the division line setting means and intersections of the bit error rate contour line and the time division line set by the division line setting means and that contains an intersection of the amplitude division line and the time division line is divided by such amplitude division line and time division line; and sampling point determination means for determining, as a sampling point in the eye diagram in question, the intersection of the time division line and the amplitude division line that are set when the largest virtual circle is calculated among the virtual circles calculated by the virtual circle calculation means.

Further, a transmission system according to a second aspect of the invention comprises: the sampling point detection circuit according to the first aspect described above; a memory for storing, as a size of a target virtual circle, the size of the virtual circle corresponding to the sampling point determined by the sampling point detection circuit by using a bit error rate contour line for a predetermined signal; and a pre-emphasis adjustment circuit for adjusting pre-emphasis intensity of a signal transmitting circuit that transmits a signal input to an input end of a transmission path so that the size of the virtual circle corresponding to the sampling point determined by the sampling point detection circuit by using a bit error rate contour line for a signal output from an output end of the transmission path when the above predetermined signal is input to the input end of the transmission path conforms to the size of the target virtual circle stored in the memory.

Thus, in the second aspect of the invention, a pre-emphasis intensity adjustment method comprises: a target value setting step of using the sampling point detection circuit according to the first aspect described above to store, in a memory, as a size of a target virtual circle, a size of the virtual circle corresponding to a sampling point determined by the sampling point detection circuit by using a bit error rate contour line for a predetermined signal; and an adjustment step of adjusting pre-emphasis intensity of a signal transmitting circuit that transmits a signal input to an input end of a transmission path so that the size of the virtual circle corresponding to the sampling point determined by the sampling point detection circuit by using a bit error rate contour line for a signal output from an output end of the transmission path when the above predetermined signal is input to the input end of the transmission path conforms to the size of the target virtual circle stored in the memory.

Further, a logic analyzer according to a third aspect of the invention comprises the sampling point detection circuit according to the first aspect described above.

In addition, in a forth aspect of the invention, an evaluation method for evaluating transmission characteristics of a transmission path based on an eye diagram of an output signal output from an output end of the transmission path when an evaluation signal is input to an input end of the transmission path comprises: a division line setting step of successively setting, by a processor, amplitude division lines along a time axis and time division lines along an amplitude axis in a translational manner in time and amplitude axis directions, respectively, on a virtual plane having coordinate axes that are the time and amplitude axes of the eye diagram; a virtual circle calculation step of calculating, by the processor, a virtual circle that is inscribed in a divided region having the smallest area among four divided regions obtained when a region that is defined by segments each connecting intersections of a bit error rate contour line of the input eye diagram and the amplitude division line set in the division line setting step and intersections of the bit error rate contour line and the time division line set in the division line setting step and that contains an intersection of the amplitude division line and the time division line is divided by such amplitude division line and time division line; and an evaluation step of evaluating, by the processor, quality of the transmission path based on a parameter determining the size of the virtual circle calculated by the virtual circle calculation step.

Thus, the evaluation method according to the fourth aspect of the invention quantitatively calculates the degree of openness of an eye from the eye's center in an eye diagram to evaluate quality of a transmission path. The steps in the evaluation method according to the fourth aspect of the invention can be implemented in the form of a computer program that can be executed by a processor such as a computer.

The apparatus for implementing the above process and the creation of a program for causing a computer to execute the above process can be readily implemented by those skilled in the art upon understanding the following detailed description. It is also obvious to those skilled in the art that the program for causing a computer to execute the above process is stored on a recording medium.

BRIEF DESCRIPTION OF THE DRAWINGS

The present invention will be more clearly understood from the description as set below with reference to the accompanying drawings, wherein.

DESCRIPTION OF THE PREFERRED EMBODIMENTS

Figure 1:
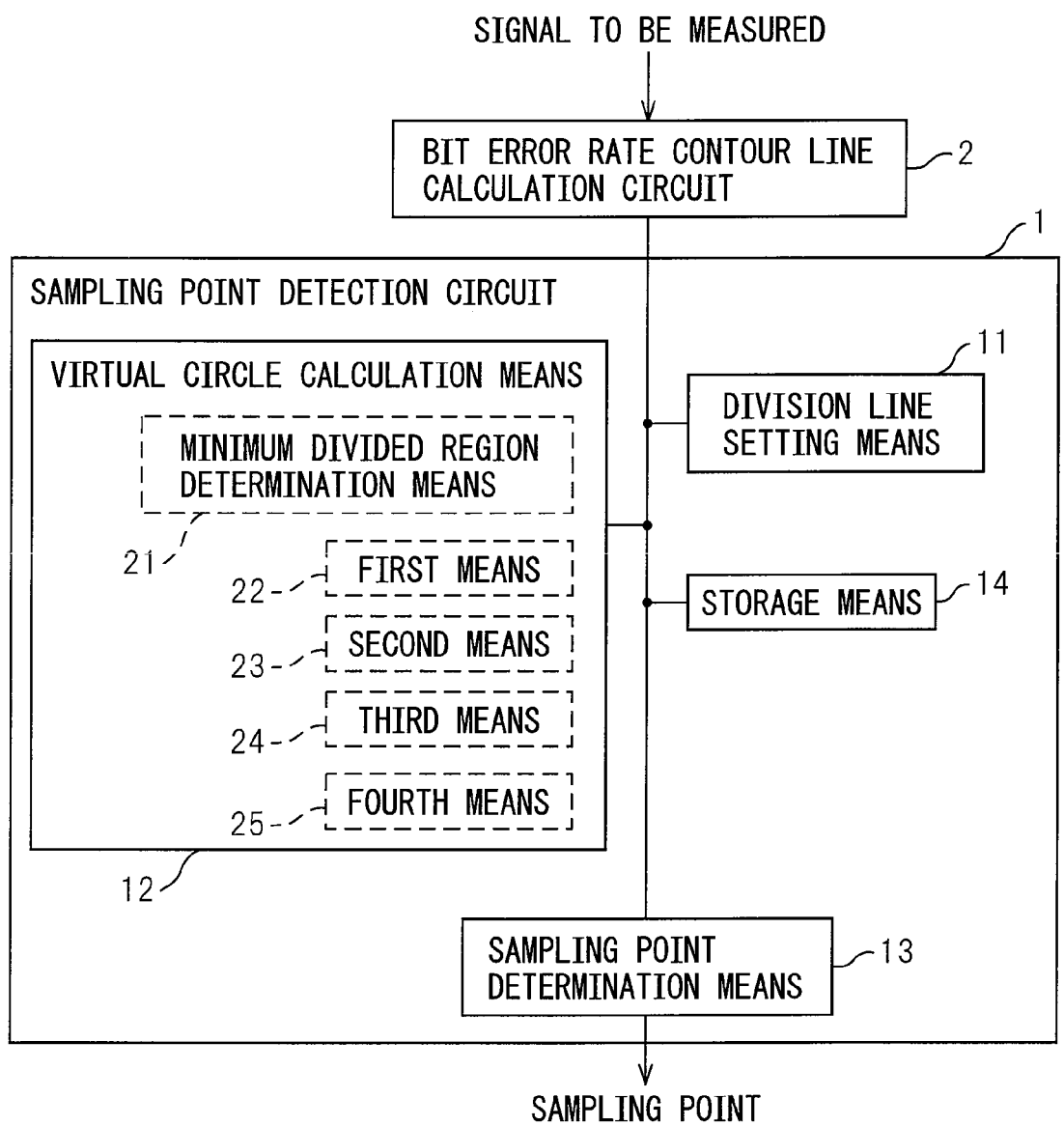
FIG. 1 is a schematic block diagram of a sampling point detection circuit according to a first embodiment of the invention.

FIG. 1 is a schematic block diagram of a sampling point detection circuit according to a first embodiment of the invention. According to the first embodiment of the invention, sampling point detection circuit 1 for detecting a sampling point in an eye diagram comprises division line setting means 11, virtual circle calculation means 12, and sampling point determination means 13.

Division line setting means 11 successively sets amplitude division lines along a time axis and time division lines along an amplitude axis in a translational manner in time and amplitude axis directions, respectively, on a virtual plane having coordinate axes that are the time and amplitude axes of an eye diagram.

Virtual circle calculation means 12 calculates a virtual circle that is inscribed in a divided region having the smallest area among four divided regions obtained when a region that is defined by segments each connecting intersections of a bit error rate (BER) contour line of the input eye diagram and the amplitude division line set by division line setting means 11 and intersections of the bit error rate contour line and the time division line set by division line setting means 11 and that contains an intersection of the amplitude division line and the time division line is divided by such amplitude division line and time division line.

Sampling point determination means 13 determines, as a sampling point in the eye diagram in question, the intersection of the time division line and the amplitude division line that are set when the largest virtual circle is calculated among the virtual circles calculated by the virtual circle calculation means. The size of the virtual circle is determined by a parameter such as a radius, diameter, area or circumferential length.

More specifically, virtual circle calculation means 12 has smallest divided region determination means 21 and first to fourth means 22 to 25.

Smallest divided region determination means 21 in virtual circle calculation means 12 determines, as the divided region having the smallest area, the divided area whose two sides are the shortest segment among two segments connecting the intersection of the time division line and the amplitude division line and the intersections of the time division line and the bit error rate contour line and the shortest segment among two segments connecting the intersection of the time division line and the amplitude division line and the intersections of the amplitude division line and the bit error rate contour line, among the four divided regions obtained when the region that is defined by the segments each connecting the intersections of the bit error rate contour line and the amplitude division line and the intersections of the bit error rate contour line and the time division line and that contains the intersection of the amplitude division line and the time division line is divided by such amplitude division line and time division line.

First means 22 in virtual circle calculation means 12 calculates the largest virtual circle among a plurality of the virtual circles calculated by using the amplitude division line that is set at the position where the distance between the intersections of the amplitude division line and the bit error rate contour line has the largest value and the time division lines that are successively set in a translational manner in the time axis direction. First means 22 stores, in storage means 14, information about the size of the calculated largest virtual circle described above and information about the position of the time division line when such largest virtual circle is calculated.

Second means 23 in virtual circle calculation means 12 performs a determination process for determining on which side the largest virtual circle calculated by first means 22 as described above exists in the amplitude axis direction with regard to such amplitude division line that is set at the position where the distance between the intersections of the amplitude division line and the bit error rate contour line has the largest value. Second means 23 stores, in storage means 14, information about the determination result on which side the largest virtual circle calculated by first means 22 as described above exists in the amplitude axis direction with respect to such amplitude division line that is set at the position where the distance between the intersections of the amplitude division line and the bit error rate contour line has the largest value.

Third means 24 in virtual circle calculation means 12 performs a calculation process for calculating the largest virtual circle among a plurality of the virtual circles calculated by using an amplitude division line that is newly set at a position opposite to the side where the largest virtual circle determined by second means 23 exists with respect to the previous amplitude division line and the time division lines that are successively set in a translational manner in the time axis direction. Third means 24 stores, in storage means 14, information about the size of the calculated largest virtual circle and information about the positions of the amplitude division line and the time division line when such largest virtual circle is calculated.

Fourth means 25 in virtual circle calculation means 12 performs a determination process for determining whether the largest virtual circle calculated by third means 24 as described above and the largest virtual circle calculated by first means 22 as described above are located at the same side in the amplitude axis direction with respect to the amplitude division line that is set at the position where the distance between the intersections of the amplitude division line and the bit error rate contour line has the largest value or not. Fourth means 25 stores, in storage means 14, information about the determination result on whether the largest virtual circle calculated by third means 24 as described above and the largest virtual circle calculated by first means 22 as described above are located at the same side in the amplitude axis direction with respect to the amplitude division line that is set at the position where the distance between the intersections of the amplitude division line and the bit error rate contour line has the largest value.

The calculation process by third means 24 and the determination process by fourth means 25 in virtual circle calculation means 12 are performed repeatedly until fourth means 25 determines that the largest virtual circle calculated by third means 24 as described above and the largest virtual circle calculated by first means 22 as described above are not located at the same side in the amplitude axis direction with respect to the amplitude division line that is set at the position where the distance between the intersections of the amplitude division line and the bit error rate contour line has the largest value.

Division line setting means 11 repeatedly performs the following process till fourth means 25 in virtual circle calculation means 12 determines that the largest virtual circle calculated by third means 24 in virtual circle calculation means 12 as described above and the largest virtual circle calculated by first means 22 in virtual circle calculation means 12 as described above are not located at the same side in the amplitude axis direction with respect to the amplitude division line that is set at the position where the distance between the intersections of the amplitude division line and the bit error rate contour line has the largest value. Thus, division line setting means 11 repeatedly performs the process in which the amplitude division line is set newly at the position opposite to the side where the largest virtual circle determined by second means 23 in virtual circle calculation means 12 as described above exists with respect to the amplitude division line that is set at the position where the distance between the intersections of the amplitude division line and the bit error rate contour line has the largest value and, then, a plurality of the time division lines are set successively in a translational manner in the time axis direction with respect to this one newly set amplitude division line, till fourth means 25 in virtual circle calculation means 12 determines that "the two virtual circles are not located at the same side" as described above.

Means 11 to 13 and 21 to 25 in sampling point detection circuit 1 can be implemented in the form of a software or firmware program that can be executed by a processor. It is also obvious to those skilled in the art that the software program for causing the processor to execute the above processes is stored on a recording medium. Further, storage means 14 may be implemented either by a memory in the processor or by a memory that is external to such processor.

Sampling point detection circuit 1 according to the first embodiment of the invention is connected with a bit error rate contour line calculation circuit 2 for calculating the bit error contour line for the signal to be measured and outputting the contour line to virtual circle calculation means 12. As an alternative to this configuration, bit error rate contour line calculation circuit 2 may be provided not externally as illustrated in FIG. 1 but inside sampling point detection circuit 1.

Figure 2:
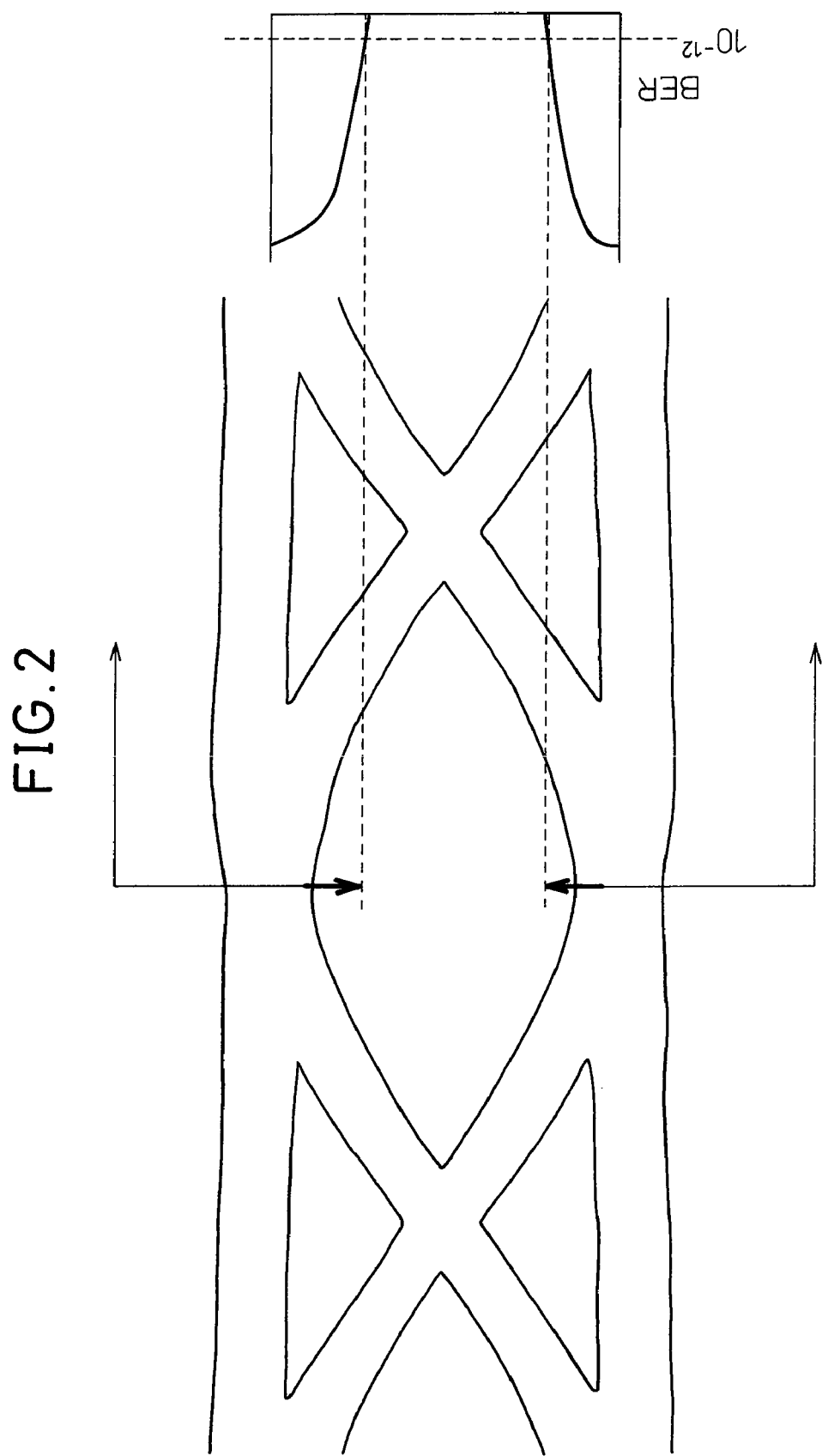
FIG. 2 is a diagram (part 1) illustrating a relationship between an eye diagram and bathtub curves.
Figure 3:
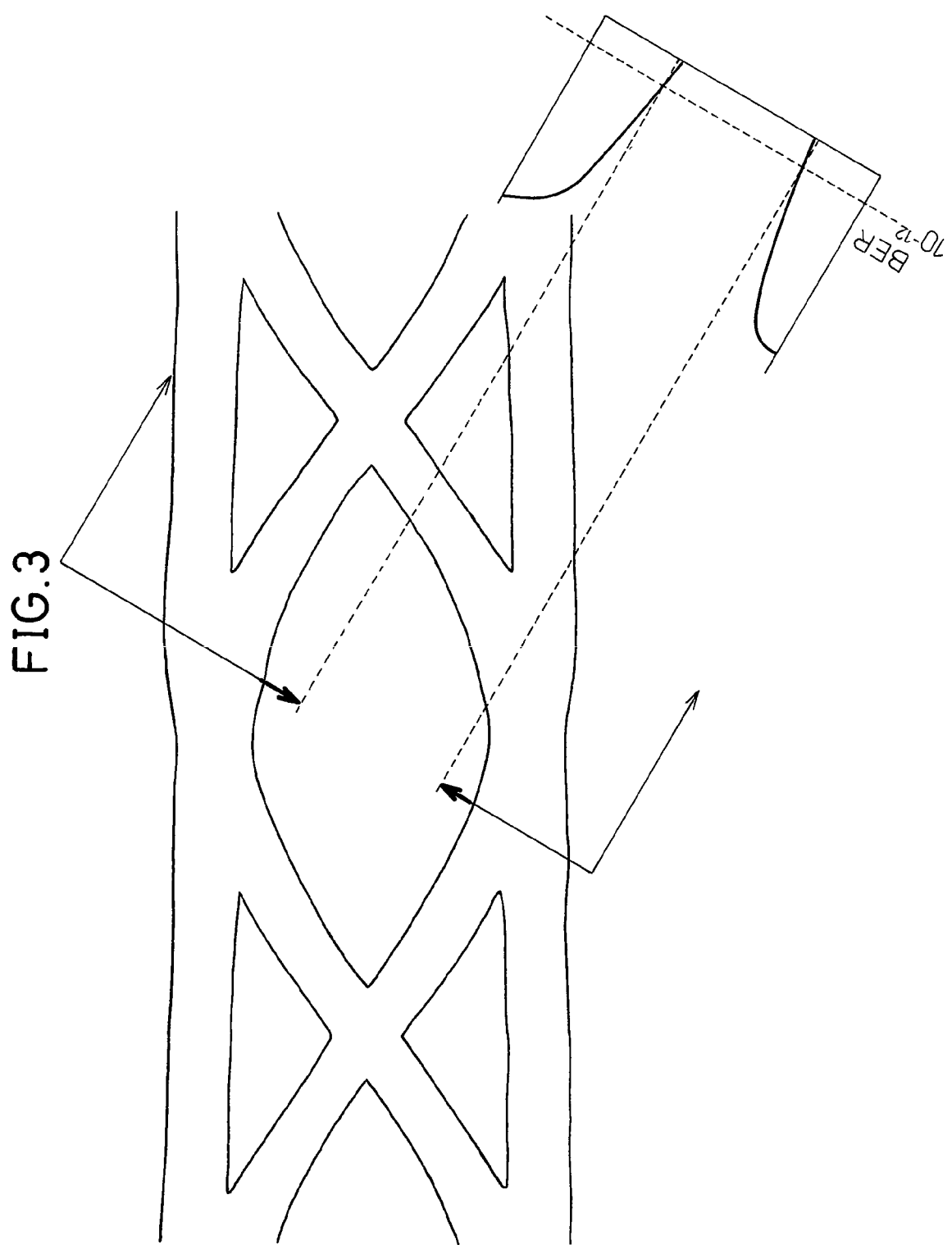
FIG. 3 is a diagram (part 2) illustrating a relationship between an eye diagram and bathtub curves.
Figure 4:
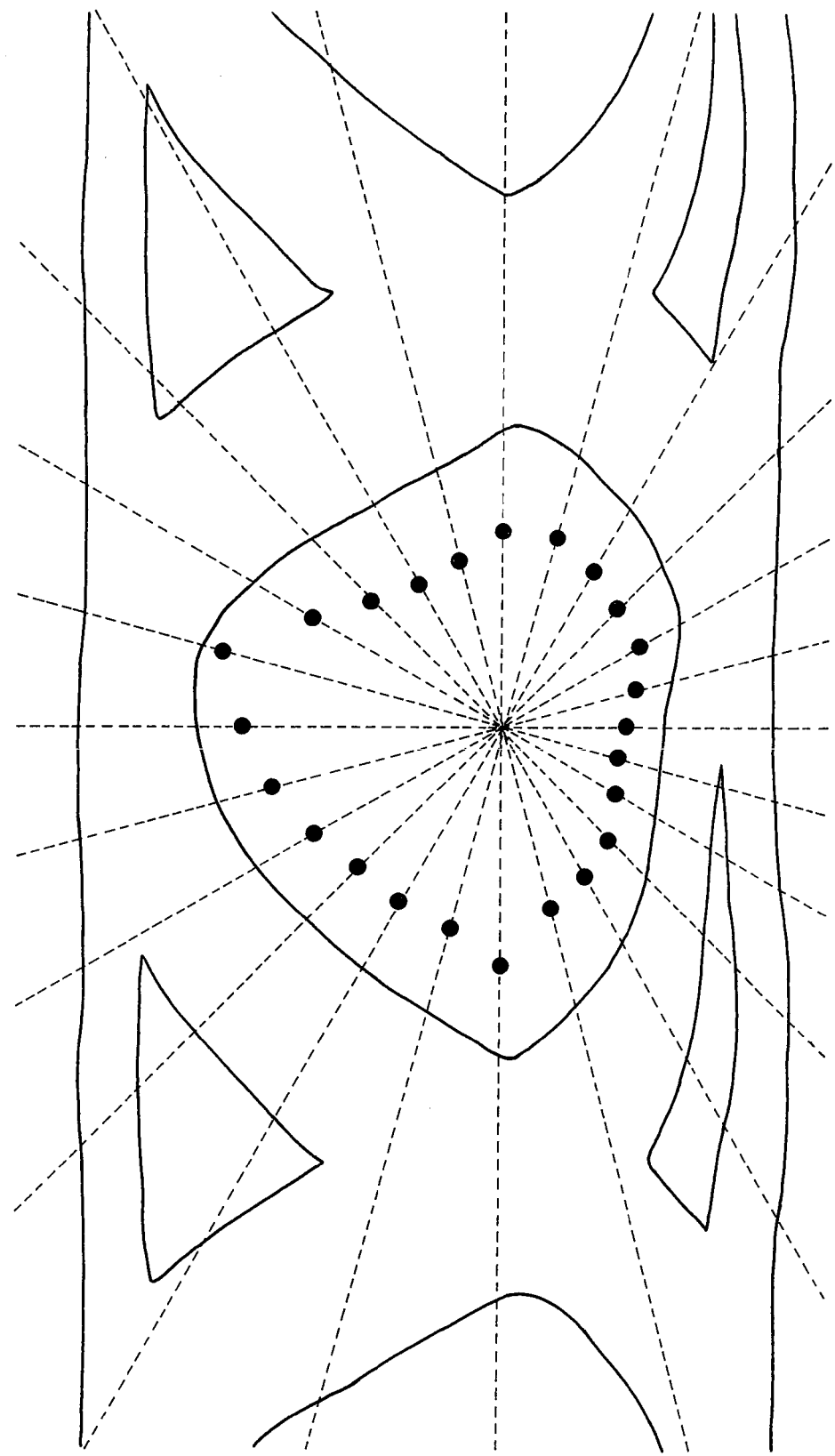
FIG. 4 is a diagram (part 3) illustrating a relationship between an eye diagram and bathtub curves.
Figure 5:
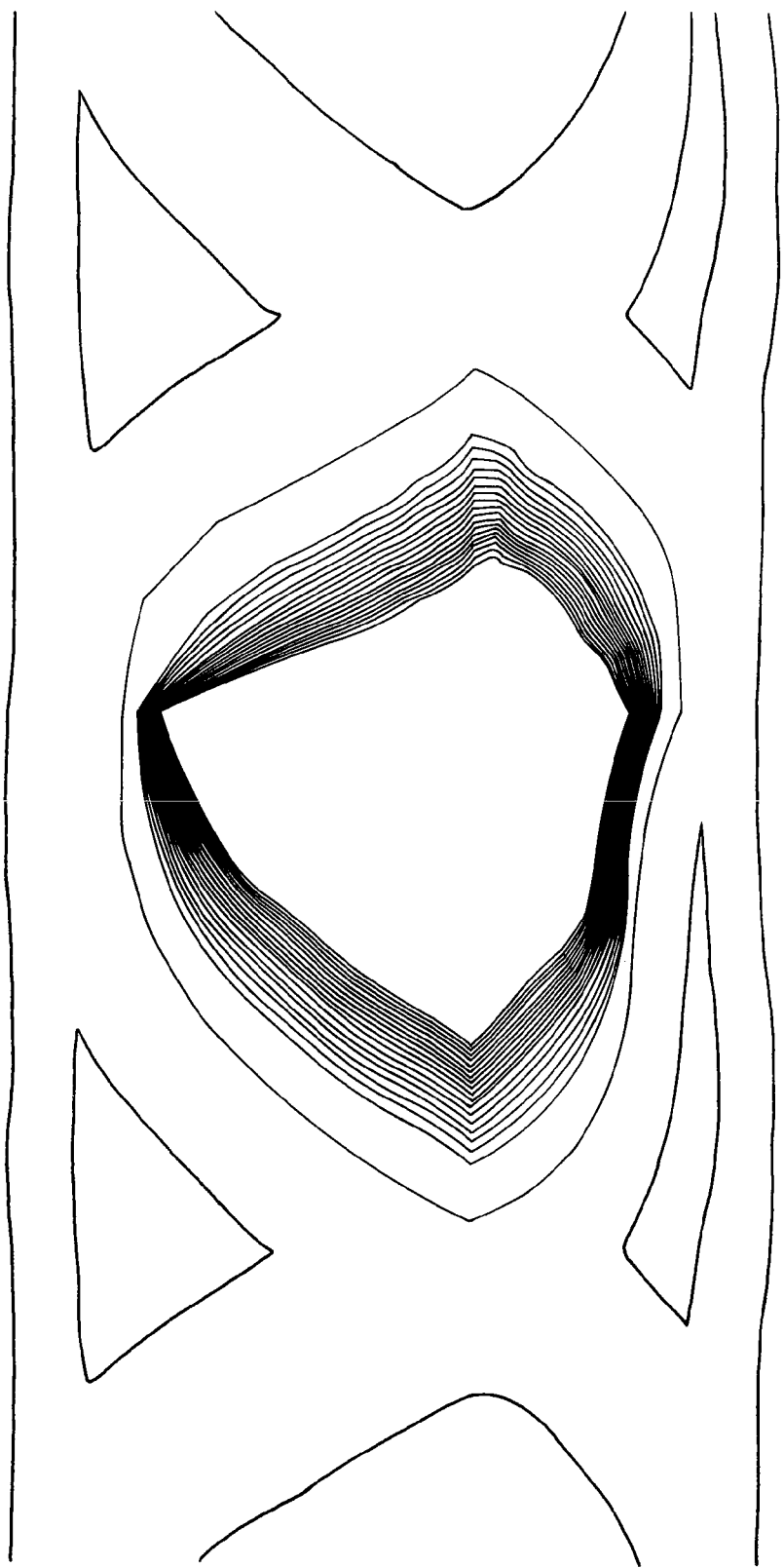
FIG. 5 is a diagram (part 4) illustrating a relationship between an eye diagram and bathtub curves.

The calculation of the bit error rate (BER) contour line will be briefly described. FIGS. 2 to 5 are diagrams each illustrating a relationship between an eye diagram and bathtub curves. As an example, the calculation of a contour line at a bit error rate of $10^{-12}$ will be described. As illustrated in FIGS. 2 and 3, points on an eye diagram corresponding to the bit error rate of $10^{-12}$ are plotted while successively changing phase and threshold values. FIG. 4 illustrates a result of the plotting of the points on the eye diagram corresponding to the bit error rate of $10^{-12}$ while successively changing the phase and threshold values. By connecting the plotted points, the bit error rate contour line as illustrated in FIG. 5 can be obtained.

Figure 6:
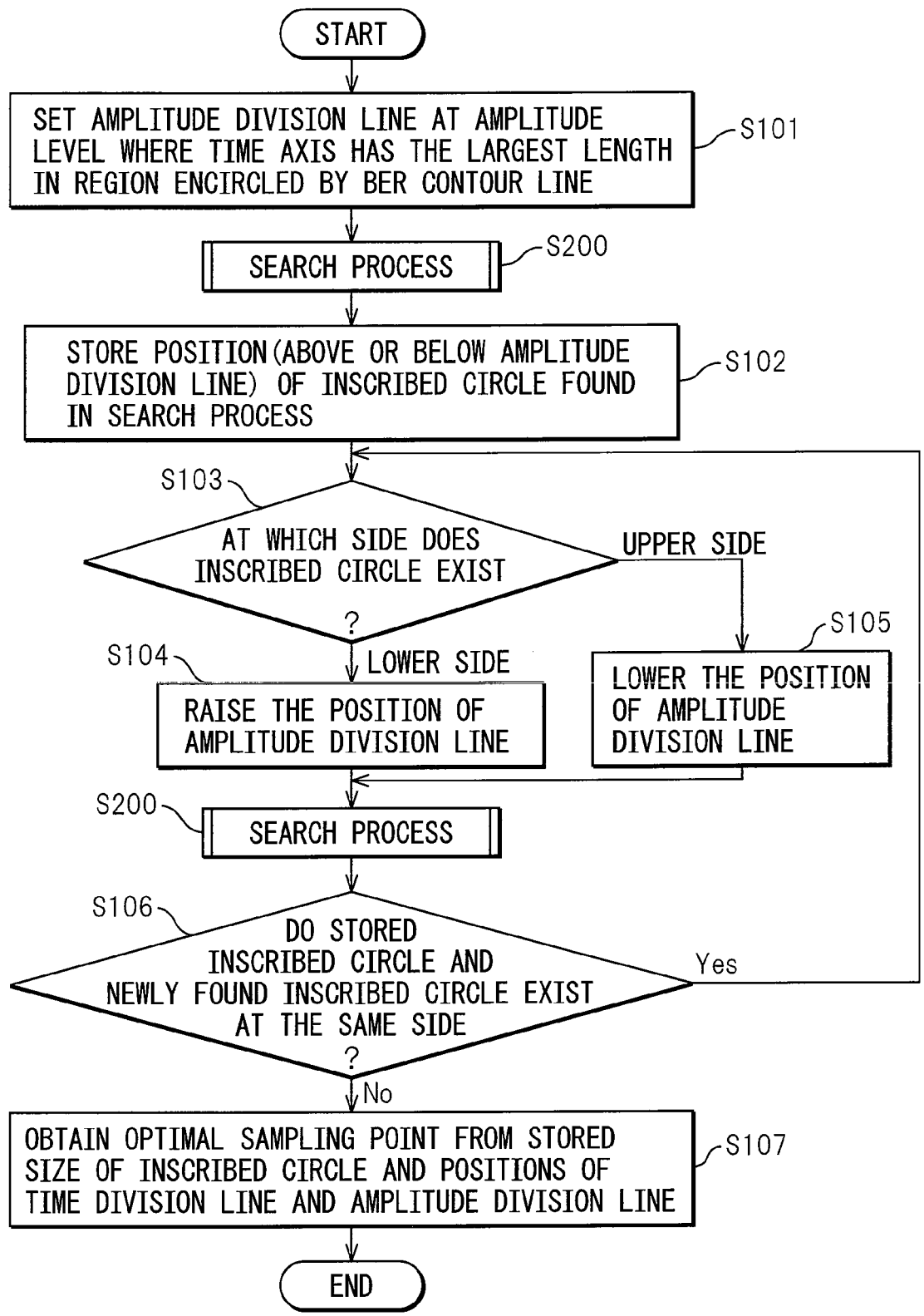
FIG. 6 is a flowchart illustrating an operational flow of sampling point detection circuit 1 according to the first embodiment of the invention.
Figure 7:
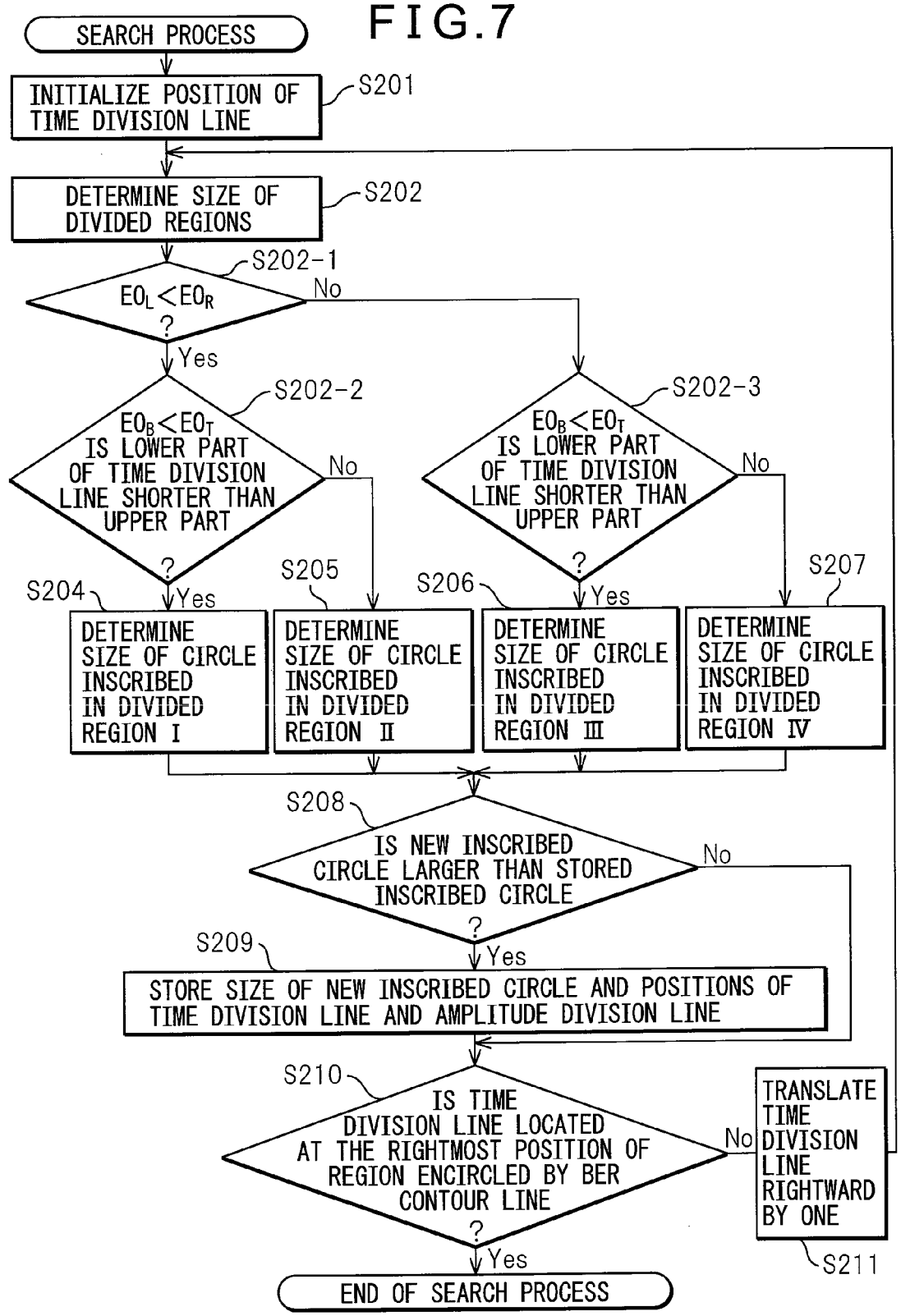
FIG. 7 is a flowchart illustrating a search process in the operational flow of sampling point detection circuit 1 according to the first embodiment of the invention.

FIG. 6 is a flowchart illustrating an operational flow of sampling point detection circuit 1 according to the first embodiment of the invention, and FIG. 7 is a flowchart illustrating a search process in the operational flow of sampling point detection circuit 1 according to the first embodiment of the invention. Further, FIGS. 8 to 11C are diagrams each illustrating the bit error rate contour line on a virtual plane having coordinate axes that are time and amplitude axes of an eye diagram. Here, by using the bit error rate (BER) contour line illustrated in FIGS. 8 to 11C as an example, the operational flow of sampling point detection circuit 1 according to the first embodiment of the invention will be described.

Figure 8:
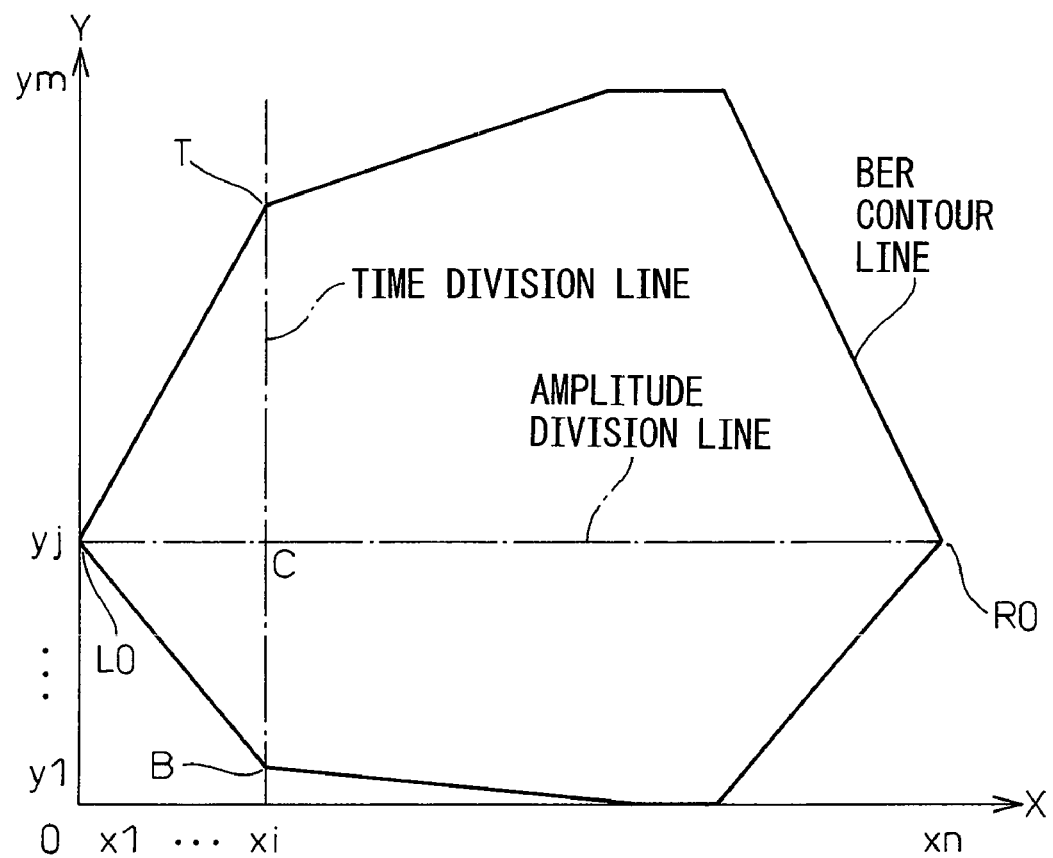
FIG. 8 is a diagram (part 1) illustrating a bit error rate contour line on a virtual plane having coordinate axes that are time and amplitude axes of an eye diagram.
Figure 9:
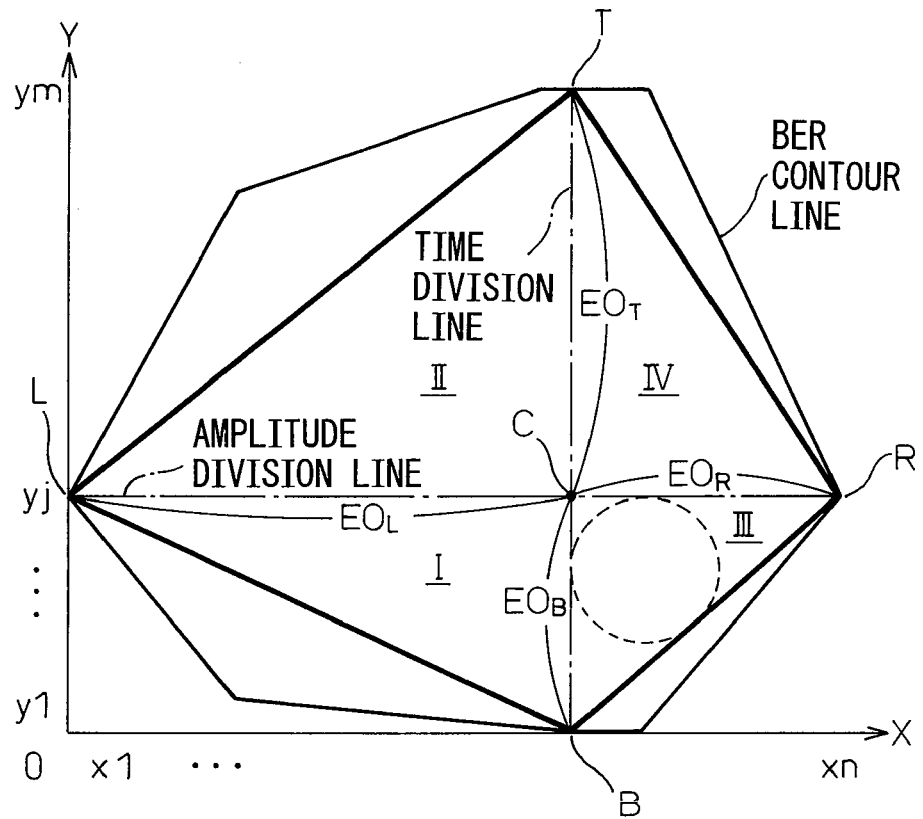
FIG. 9 is a diagram (part 2) illustrating a bit error rate contour line on a virtual plane having coordinate axes that are time and amplitude axes of an eye diagram.

As illustrated in FIG. 8, on a virtual plane having a time axis X and an amplitude axis Y, a coordinate where a time division line can be located in the direction of the time axis X is represented by $x_i$ (where i=1 to n, n is a positive integer) and a coordinate where an amplitude division line can be located in the direction of the amplitude axis Y is represented by $y_j$ (where j=1 to m, m is a positive integer). Resolution of the process is therefore determined by the values of n and m.

In step S101, on the virtual plane having the coordinate axes that are the time and amplitude axes of the eye diagram, division line setting means 11 sets the amplitude division line at the position where the distance between two intersections of the amplitude division line in the time axis direction and the bit error rate contour line of the input eye diagram. For example, assuming that the bit error rate (BER) contour line has a shape as illustrated in FIG. 8, in step S101, when the amplitude division line intersects the bit error rate contour line at intersections R0 and L0, the distance between these intersections has the largest value.

Next, the operation proceeds to the search process in step S200, which is illustrated in FIG. 7 in detail. In step S201 in FIG. 7, the position of the time division line is initialized. On the virtual plane illustrated in FIG. 8, the initial position of the time division line is set at the left most position in the region encircled by the bit error rate contour line, or the position where the value of the X coordinate is $x_1$.

Next, in step 202, smallest divided region determination means 21 in virtual circle calculation means 12 determines sizes of four divided regions that can be obtained when the region that is defined by the segments each connecting the intersections of the bit error rate contour line and the amplitude division line and the intersections of the bit error rate contour line and the time division line and that contains the intersections of the amplitude division line and the time division line is divided by such amplitude division line and time division line. In the case of the bit error rate contour line illustrated in FIG. 8, the region that is defined by the segments (represented by bold segments in the figure) mutually connecting the intersections R0 and L0 of the bit error rate contour line and the amplitude division line and the intersections T and B of the bit error rate contour line and the time division line and that contains the intersection C of the amplitude division line and the time division line is a region that is encircled by the bold segments illustrated in FIG. 9. This region is divided by such amplitude division line and time division line into the four divided regions I, II, III and IV. It is assumed that the distance of the segment between the intersection C of the time division line at the right end and the amplitude division line and the intersection R of the bit error rate contour line and the amplitude division line at the right end is $EO_R$, the distance of the segment between the intersection C of the time division line and the amplitude division line and the intersection L of the bit error rate contour line and the amplitude division line at the left end is $EO_L$, the distance of the segment between the intersection C of the time division line and the amplitude division line and the intersection T of the bit error rate contour line and the time division line at the top end is $EO_T$, and the distance of the segment between the intersection C of the time division line and the amplitude division line and the intersection B of the bit error rate contour line and the time division line at the bottom end is $EO_B$. Thus, the divided region I has a right triangular shape whose two sides are the segment of the distance $EO_L$ and the segment of the distance $EO_B$; the divided region II has a right triangular shape whose two sides are the segment of the distance $EO_L$ and the segment of the distance $EO_T$; the divided region III has a right triangular shape whose two sides are the segment of the distance $EO_R$ and the segment of the distance $EO_B$; and the divided region IV has a right triangular shape whose two sides are the segment of the distance $EO_R$ and the segment of the distance $EO_T$.

The determination of the size of the divided regions in step S202 is implemented by processes in steps S202-1, S202-2 and S202-3. Through these processes, among the four right triangular divided regions I, II, III and IV, the divided region whose two sides are the shortest segment among the two segments each connecting the intersection C of the time division line and the amplitude division line and the intersection R or L of the amplitude division line and the bit error rate contour line and the shortest segment among the two segments each connecting the intersection C of the time division line and the amplitude division line and the intersection T or B of the time division line and the bit error rate contour line is determined as the divided region having the smallest area.

In step S202-1, it is determined whether the distance $EO_L$ of the segment between the intersection C of the time division line and the amplitude division line and the intersection L of the amplitude division line and the bit error rate contour line at the left end is smaller than the distance $EO_R$ of the segment between the intersection C of the time division line and the amplitude division line and the intersection R of the amplitude division line and the bit error rate contour line at the right end or not. If it is determined that the distance $EO_L$ of the segment between the intersection C and the intersection L is smaller, the operation proceeds to step S202-2. If not, the operation proceeds to step S202-3.

In step S202-2, it is determined whether the distance $EO_B$ of the segment between the intersection C of the time division line and the amplitude division line and the intersection B of the time division line and the bit error rate contour line at the bottom end is smaller than the distance $EO_T$ of the segment, between the intersection C of the time division line and the amplitude division line and the intersection T of the time division line and the bit error rate contour line at the top end or not. If it is determined that the distance $EO_B$ of the segment between the intersection C and the intersection B is smaller, the divided region I has the smallest area among the four divided regions I, II, III and IV and the operation therefore proceeds to step S204 where the size of the virtual circle inscribed in the divided region I is determined. If not, the divided region II has the smallest area and the operation therefore proceeds to step S205 where the size of the virtual circle inscribed in the divided region II is determined.

In step S202-3, it is determined whether the distance $EO_B$ of the segment between the intersection C of the time division line and the amplitude division line and the intersection B of the time division line and the bit error rate contour line at the bottom end is smaller than the distance $EO_T$ of the segment between the intersection C of the time division line and the amplitude division line and the intersection T of the time division line and the bit error rate contour line at the top end or not. If it is determined that the distance $EO_B$ of the segment between the intersection C and the intersection B is smaller, the divided region III has the smallest area among the four divided regions I, II, III and IV and the operation therefore proceeds to step S206 where the size of the virtual circle inscribed in the divided region III is determined. If not, the divided region IV has the smallest area and the operation therefore proceeds to step S207 where the size of the virtual circle inscribed in the divided region IV is determined.

Figure 12:
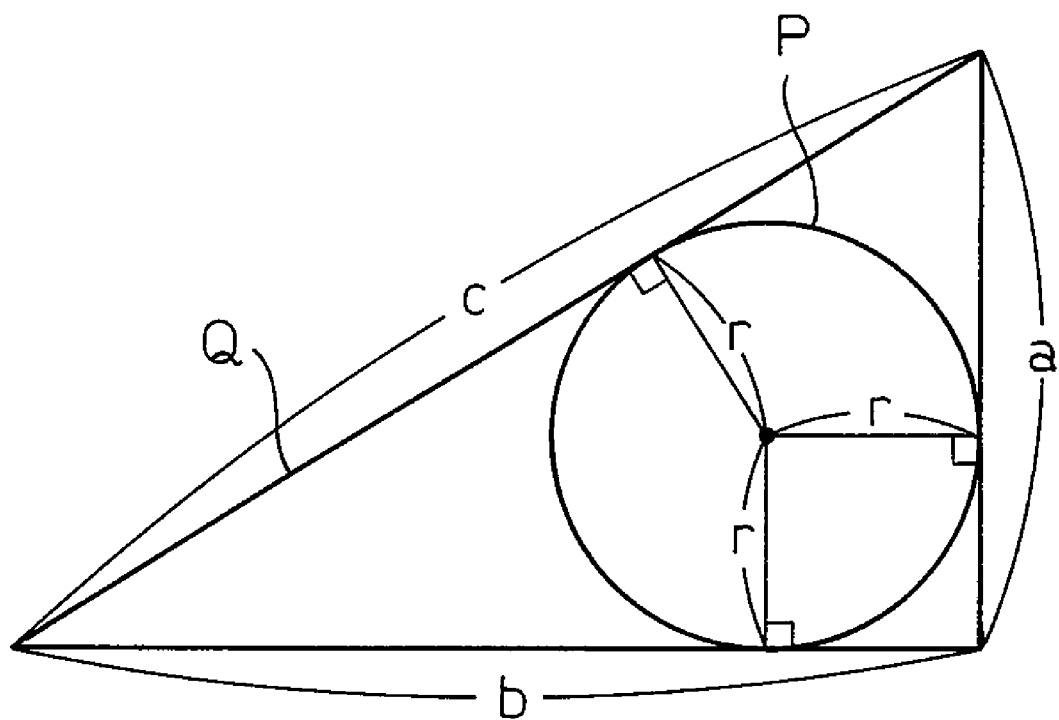
FIG. 12 is a diagram describing calculation of a virtual circle in the first embodiment of the invention.

The parameter used for determining the size of the virtual circle is any of a radius, diameter, area or circumferential length of the virtual circle. The radius, diameter, area or circumferential length uniquely determines the size of the virtual circle. For example, the size of the virtual circle is determined by the radius as follows. FIG. 12 is a diagram describing calculation of a virtual circle in the first embodiment of the invention.

It is assumed that a triangle Q has two sides adjacent to a right angle a and b and a hypotenuse c, wherein its area is S and a radius of a circle inscribed in it is r. At this time, an equation (1) is obtained from Hero's formula:

$$S = \frac{ar + br + cr}{2} \qquad (1)$$
$$= \frac{r(a+b+c)}{2}$$

By transforming the equation (1), an equation (2) is obtained:

$$r = \frac{2S}{a+b+c} \qquad (2)$$

Because the triangle Q is a right triangle, its area is expressed by an equation (3):

$$S = \frac{ab}{2} \qquad (3)$$

By substituting the equation (3) into the equation (1), an equation (4) is obtained:

$$r = \frac{2\left(\frac{ab}{2}\right)}{a+b+c} \qquad (4)$$
$$= \frac{ab}{a+b+c}$$

The Pythagorean theorem is expressed by an equation (5):

$$c=\sqrt{a^2+b^2} \qquad (5)$$

By substituting the equation (5) into the equation (4), an equation (6) is obtained:

$$r = \frac{ab}{a+b+\sqrt{a^2+b^2}} \qquad (6)$$

As illustrated in the equation (6), the radius r of the virtual circle P inscribed in the right triangle Q can be expressed only by the two sides adjacent to the right angle. The radius r of the virtual circle r inscribed in the triangle increases as the side a or b increases, and the radius r is restricted by the shorter one of the sides a and b. This means that the radius r of the virtual circle quantitatively expresses the region where the eye opening ratio has the worst value.

After the size of the virtual circle inscribed in "the divided region having the smallest area" is calculated by any of the processes in steps S204 to S207, the operation proceeds to step S208.

In step S208, virtual circle calculation means 12 determines whether the newly calculated size of the virtual circle is larger than the previously calculated and saved size of the virtual circle or not. If it is determined that the newly calculated size of the virtual circle is larger, the operation proceeds to step S209. If not, the operation proceeds to step S210. In the first operation cycle, because "the previously calculated and saved size of the virtual circle" does not exist, the operation directly proceeds to step S209.

In step S209, virtual circle calculation means 12 stores, in storage means 14, information about the size of the newly calculated size of the virtual circle. At this time, information about the positions of the time division line and the amplitude division line when the virtual circle in question is calculated is also stored in storage means 14. In the first operation cycle, because "the previously calculated and saved size of the virtual circle" to be compared with the newly calculated size of the virtual circle does not exist as described above, in the next step S209, information about the newly calculated size of the virtual circle and information about the position of the time division line when the size of the virtual circle in question is calculated are stored in storage means 14 (the process by first means 22 in virtual circle calculation means 12). At this time, when the amplitude division line is located to intersect at the intersections R0 and L0, the distance between these intersections has the largest value.

In step S210, division line setting means 11 determines whether the current position $x_i$ of the time division line is located at the rightmost position in the region encircled by the bit error rate contour line or the position where the x coordinate is $x_m$ or not. If the time division line is not located at the rightmost position (the position where the x coordinate is $x_m$), the operation proceeds to step S211 and, in this step S211, the coordinate of the time division line is newly set at the coordinate $x_{i+1}$ that is translated rightward by one from the current coordinate $x_i$. On the other hand, if it is determined that the time division line is located at the right most position (the position where the x coordinate is $x_m$), the search process S200 terminates.

After division line setting means 11 newly sets the time division line in step S211, the operation returns to step S202, where the processes described above are performed again for the four divided regions divided by the amplitude division line and the newly set time division line. More specifically, the time division line is successively translated along the amplitude division line once set by division line setting means 11. The processes described above are performed by using the one set amplitude division line and the successively set time division line to calculate, with respect to such one set amplitude division line, the virtual circle inscribed in the divided region having the smallest area.

By performing the above processes for all the amplitude division lines that can intersect the bit error rate contour line, a plurality of "the virtual circles each inscribed in the divided region having the smallest area" can be calculated. In the first embodiment of the invention, the intersection of the time division line and the amplitude division line that are set when the largest virtual circle among the plurality of "the virtual circle each inscribed in the divided region having the smallest area" is set as the sampling point in the eye diagram in question.

Though the sampling point can be detected by using the sampling point detection circuit according to the first embodiment of the invention, in the first embodiment of the invention, in order to reduce the time required for the search process, the following process is performed.

Figure 10A:
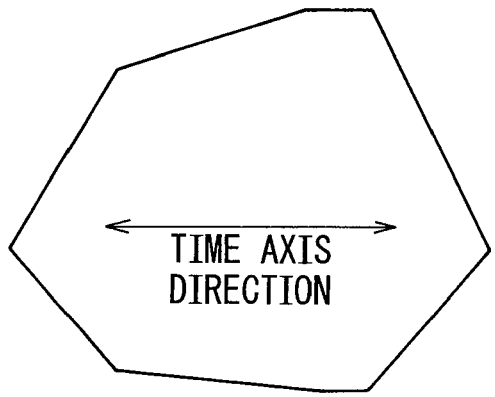
FIGS. 10A and 10B are diagrams (part 3) each illustrating a bit error rate contour line on a virtual plane having coordinate axes that are time and amplitude axes of an eye diagram.
Figure 10B:
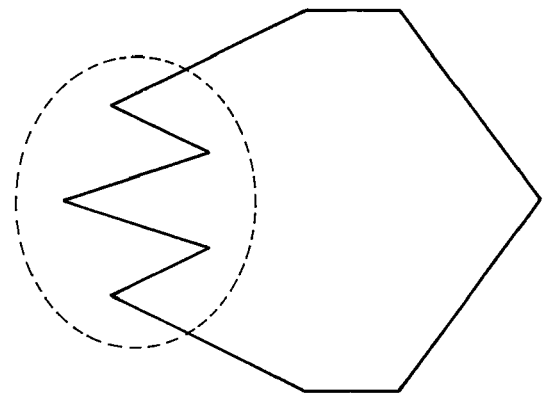
Figure 11A:
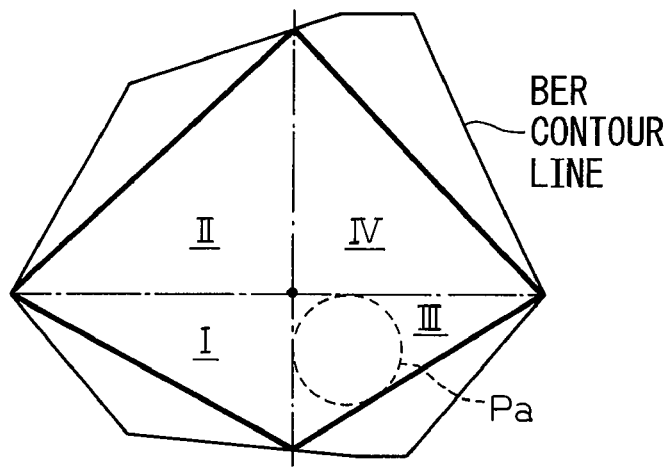
FIGS. 11A to 11C are diagrams (part 4) each illustrating a bit error rate contour line on a virtual plane having coordinate axes that are time and amplitude axes of an eye diagram.
Figure 11B:
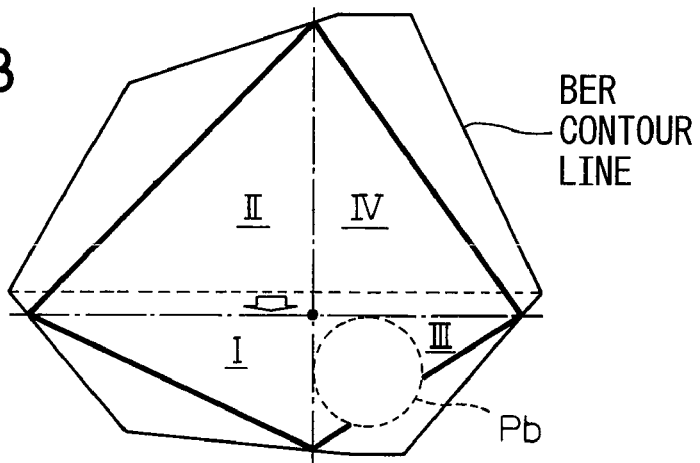
Figure 11C:
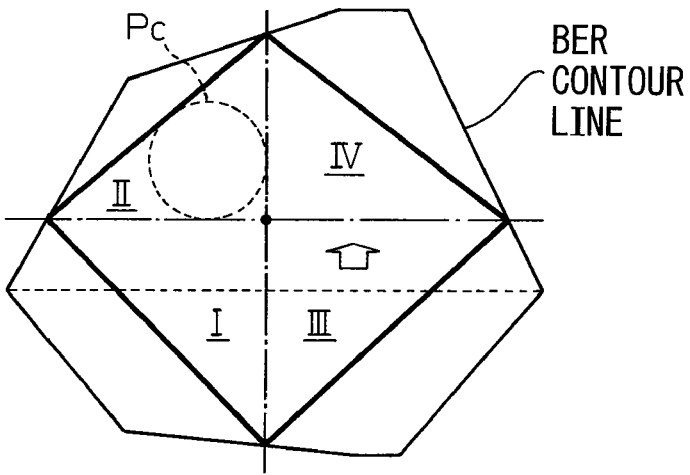

In the time axis direction, the bit error rate contour line always has a convex shape as illustrated in FIG. 10A and it never has a concave shape as illustrated in FIG. 10B. Consequently, when the amplitude division line set at the position where the distance between the intersections of the bit error rate contour line and the amplitude division line has the largest value is moved in any one direction along the amplitude axis, the distance between the intersections of the bit error rate contour line and the amplitude division line is reduced. Based on this fact, the following can be stated. First, as illustrated in FIG. 11A, the amplitude division line is set at the position where the distance between the intersections of the bit error rate contour line and the amplitude division line has the largest value and "the largest virtual circle" described above is calculated. At this time, if the amplitude division line is newly set at the position that is shifted toward the side where the virtual circle exists in the amplitude axis direction with respect to the first amplitude division line, the distance between the intersections of the bit error rate contour line and the amplitude division line and the distance between the intersection of the bit error rate contour line and the time division line and the intersection of the amplitude division line and the time division line are reduced. As a result, as illustrated in FIG. 11B, it is impossible that the virtual circle Pb that has a size larger than or equal to that of the virtual circle in FIG. 11A exists, wherein the virtual circle in FIG. 11A is "the largest virtual circle calculated when the amplitude division line is set at the position where the distance between the intersections with the bit error rate contour line has the largest value". Consequently, the amplitude division line is not set at the side where "the largest virtual circle calculated when the amplitude division line is set at the position where the distance between the intersections with the bit error rate contour lines has the largest value" exists in the amplitude axis direction with respect to the amplitude division line. In contrast, only in the "opposite" amplitude axis direction (in the upper half region in the example of the FIGS. 11A to 11C), the new amplitude division lines are successively set in a translational manner to calculate "the largest virtual circles". "The process for setting the amplitude division lines" and "process for calculating the largest virtual circles" are repeatedly performed till "the largest virtual circle Pc" is calculated at the side opposite to that where "the virtual circle calculated when the amplitude division line is set at the position where the distance between the intersections with the bit error rate contour line has the largest value". By doing this, the time required for the search process can be reduced. This process is specifically illustrated in steps S102 to S107 in FIG. 6.

In step S102 in FIG. 6, virtual circle calculation means 12 stores, in storage means 14, information about at which side the largest virtual circle inscribed in the smallest divided region when the amplitude division line is set at the position where the distance between the intersections of the amplitude division line and the bit error rate contour line has the largest value calculated in the search process S200 exists in the amplitude axis direction with respect to the amplitude division line.

In step S103, second means 23 in virtual circle calculation means 12 performs a determination process for determining at which side "the largest virtual circle calculated when the amplitude division line is set at the position where the distance between the intersections with the bit error rate contour line has the largest value" exists in the amplitude axis direction with respect to such amplitude division line that is set at the position where the distance between the intersections of the amplitude division line and the bit error rate contour line has the largest value. If the virtual circle exists at the lower side (the side where the regions I and III in FIG. 9 exist), the operation proceeds to step S104. If the virtual circle exists at the upper side (the side where the regions II and IV in FIG. 9 exist), the operation proceeds to step S105.

In step S104, division line setting means 11 newly sets the amplitude division line at the coordinate $y_{j+1}$ that is translated upward by one from the previous coordinate $y_j$. On the other hand, in step S105, division line setting means 11 newly sets the amplitude division line at the coordinate $y_{j-1}$ that is translated downward by one from the previous coordinate $y_j$. Then, with respect to the one newly set amplitude division line, the search process S200 is performed. More specifically, the search process S200 is performed by using the one newly set amplitude division line and the successively set time division lines and the calculation process is performed to calculate "the largest virtual circle" inscribed in the divided region having the smallest area with respect to such one set amplitude division line. The information about the size of the above calculated "largest virtual circle" and the information about the positions of the amplitude and time division lines when such largest virtual circle is calculated are stored in storage means 14.

In step S106, fourth means 25 in virtual circle calculation means 12 uses "the information of which side the largest virtual circle is inscribed in the smallest divided region when the amplitude division line is set at the position where the distance between the intersections of the amplitude division line and the bit error rate contour line has the largest value in the amplitude axis direction at this time with respect to the amplitude division line" stored in storage means 14 to perform a determination process for determining whether the "largest virtual circle" calculated in the immediately preceding search process S200 and "the largest virtual circle inscribed in the smallest divided area when the amplitude division line is set at the position where the distance between the intersections of the amplitude division line and the bit error rate contour line has the largest value" exist at the same side in the amplitude axis direction with respect to the amplitude division line set at the position where the distance between the intersections of the amplitude division line and the bit error rate contour line has the largest value or not. If it is determined that they exist at the same side, the operation returns to step S103. If it is determined that they do not exist at the same side, the operation proceeds to step S107. Information on the determination result on whether the largest virtual circle calculated by third means 24 as described above and the largest virtual circle calculated by first means 22 as described above exist at the same side in the amplitude axis direction with respect to the amplitude division line set at the position where the distance between the intersections of the amplitude division line and the bit error rate contour line has the largest value is stored in storage means 14.

The calculation process and the determination process by third means 24 and fourth means 25, respectively, in virtual circle calculation means 12 in step S103 to S106 are repeatedly performed until fourth means 25 determines that "the largest virtual circle calculated by third means 24 as described above and the largest virtual circle calculated by first means 22 as described above are not located at the same side in the amplitude axis direction with respect to the amplitude division line set at the position where the distance between the intersections of the amplitude division line and the bit error rate contour line has the largest value".

In step S107, sampling point determination means 13 determines the intersection of the time division line and the amplitude division line that is set when "the largest virtual circle" stored in storage means 14 is calculated as the sampling point in the eye diagram in question.

As described above, in the first embodiment of the invention, the effective region in the bit error rate contour line is appropriately divided by the time division line and the amplitude division line to calculate the virtual circle and the intersection of the time division line and the amplitude division line satisfying the predetermined requirements is determined as the sampling point. Since the time division line and the amplitude division line as described above can be set not only in the eye diagram whose eye opening shape is symmetrical in the amplitude and time axis directions but also even in the eye diagram whose eye opening shape is asymmetrical in the amplitude and/or time axis directions, the sampling point in the eye diagram can be detected quickly and accurately.

Figure 14:
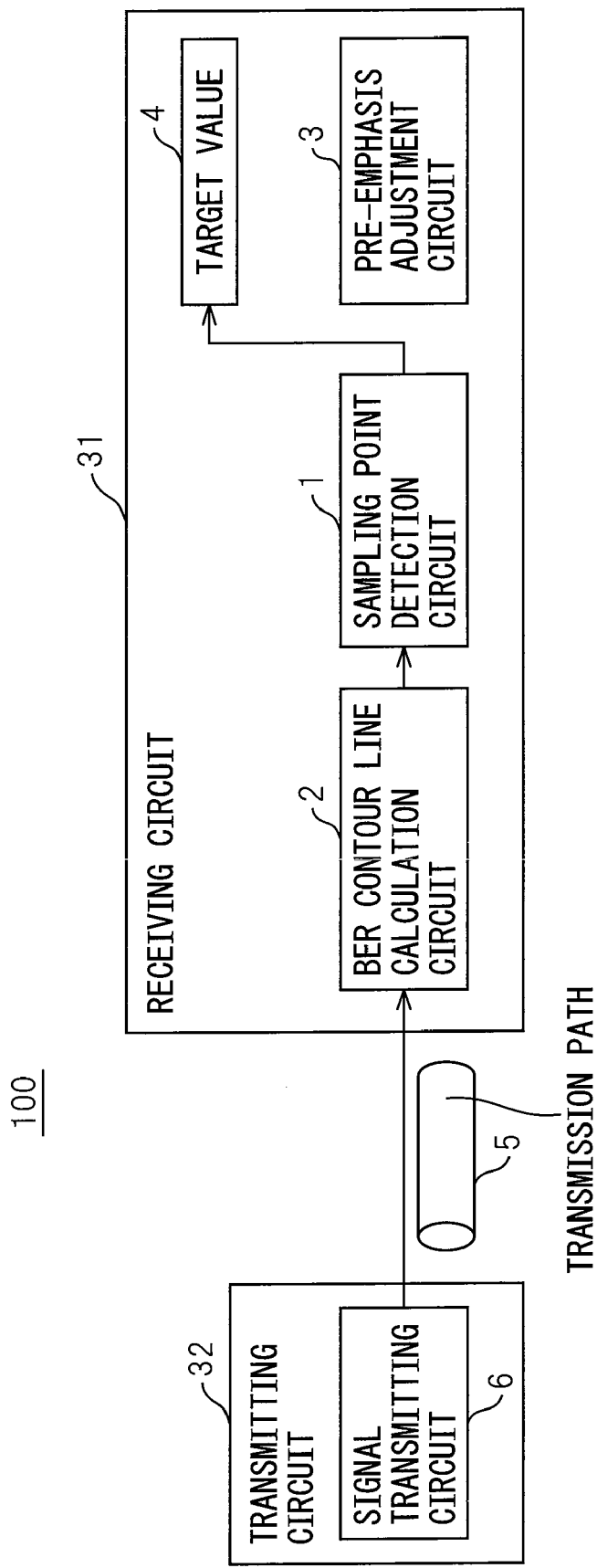
FIG. 14 is a block diagram (part 1) for describing a transmission system according to a second embodiment of the invention.
Figure 15:
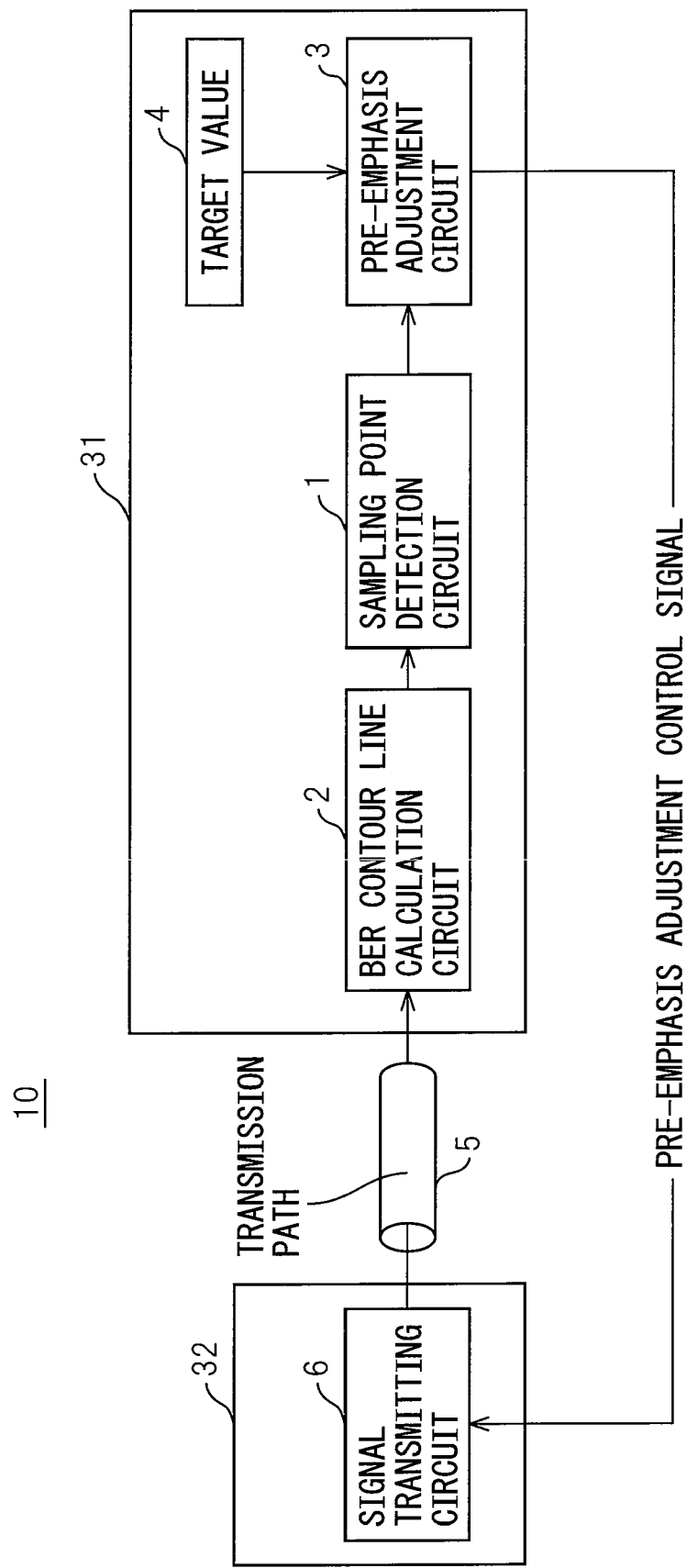
FIG. 15 is a block diagram (part 2) for describing a transmission system according to a second embodiment of the invention.
Figure 16:
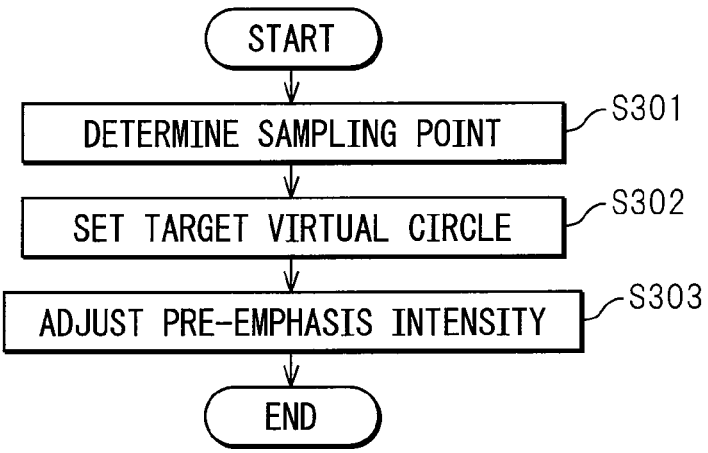
FIG. 16 is a flowchart illustrating an operational flow of a pre-emphasis intensity adjustment method based on the transmission system according to the second embodiment of the invention.

In a transmission system and a pre-emphasis intensity adjustment method according to a second embodiment of the invention, the sampling point detection circuit according to the first embodiment of the invention as described above is used to adjust pre-emphasis intensity of a signal transmission circuit for transmitting a signal input to an input end of a transmission path. FIGS. 14 and 15 are block diagrams for describing the transmission system according to the second embodiment of the invention. FIG. 16 is a flowchart illustrating an operational flow of the pre-emphasis intensity adjustment method based on the transmission system according to the second embodiment of the invention.

Transmission system 10 according to the second embodiment of the invention comprises, as a receiving circuit 31, sampling point detection circuit 1 according to the first aspect described above, a bit error rate (BER) contour line calculation circuit 2, a memory 4 for storing a size of a target virtual circle, and a pre-emphasis adjustment circuit 3. A transmission path 5 is connected to receiving circuit 31. On the other hand, transmission system 10 comprises, as a transmitting circuit 32, a signal transmitting circuit 6 for transmitting a digital signal to transmission path 5.

First, in step S301 in FIG. 16, receiving circuit 31 is directly connected with transmitting circuit 32 not via transmission path 5 as illustrated in FIG. 14. Then, signal transmitting circuit 6 transmits a predetermined signal to receiving circuit 31 and sampling point detection circuit 1 according to the first embodiment of the invention described above determines a sampling point by using a bit error rate contour line calculated by bit error rate contour line calculation circuit 2 for the predetermined signal.

Next, in step S302, a size of a virtual circle corresponding to the sampling point detected by sampling point detection circuit 1 is set as "the size of the target virtual circle" and stored in memory 4.

Next, in step S303, receiving circuit 31 is connected with transmitting circuit 32 via transmission path 5 as illustrated in FIG. 15. Then, signal transmitting circuit 6 transmits the above predetermined signal same as that in step S301 to an input end of transmission path 5 and bit error rate contour line calculation circuit 2 calculates a bit error rate contour line for the signal received by receiving circuit 31 (or, in other words, the signal output from an output end of transmission path 5).

Sampling point detection circuit 1 determines a sampling point by using the bit error rate contour line for the signal output from the output end of transmission path 5. Pre-emphasis adjustment circuit 3 reads out the information about "the size of the target virtual circle" stored in memory 4 and transmits a pre-emphasis adjustment control signal to signal transmitting circuit 6 to adjust the pre-emphasis intensity of signal transmitting circuit 6 that transmits the signal input to the input end of the transmission path so that the size of the virtual circle corresponding to the sampling point determined by the sampling point detection circuit 1 by using the bit error rate contour line for the signal output from the output end of transmission path 5 conforms to the size of the target virtual circle read out of memory 4. For example, when "the size of the virtual circle" is determined by its radius, the pre-emphasis adjustment control signal that allows the radius of the virtual circle corresponding to the sampling point determined by sampling point detection circuit 1 using the bit error rate contour line for the signal output from the output end of transmission path 5 to conform the radius of the target virtual circle is generated and transmitted to signal transmitting circuit 6.

Figure 13A:
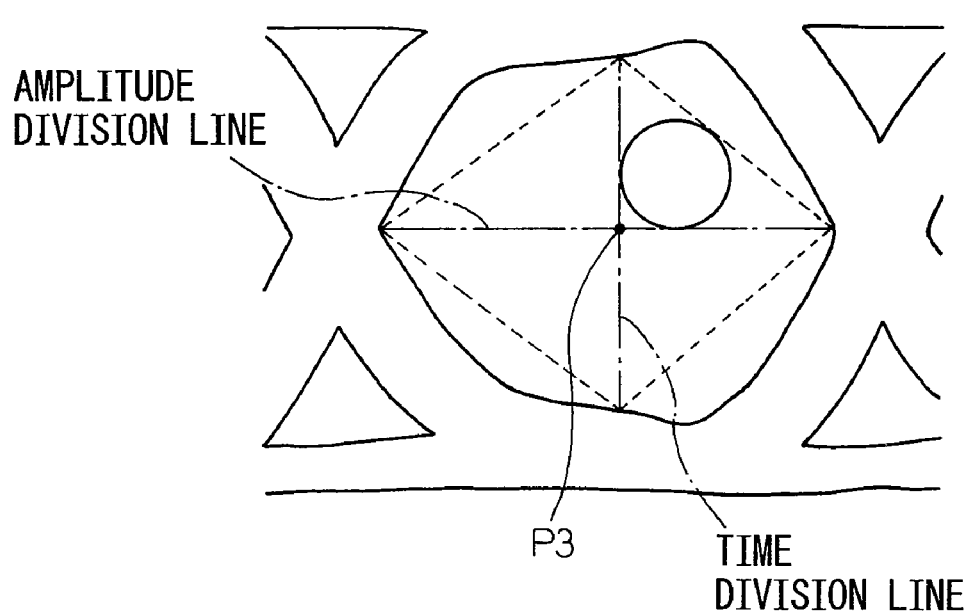
FIGS. 13A and 13B are diagrams illustrating application of the first embodiment of the invention to an eye diagram.
Figure 13B:
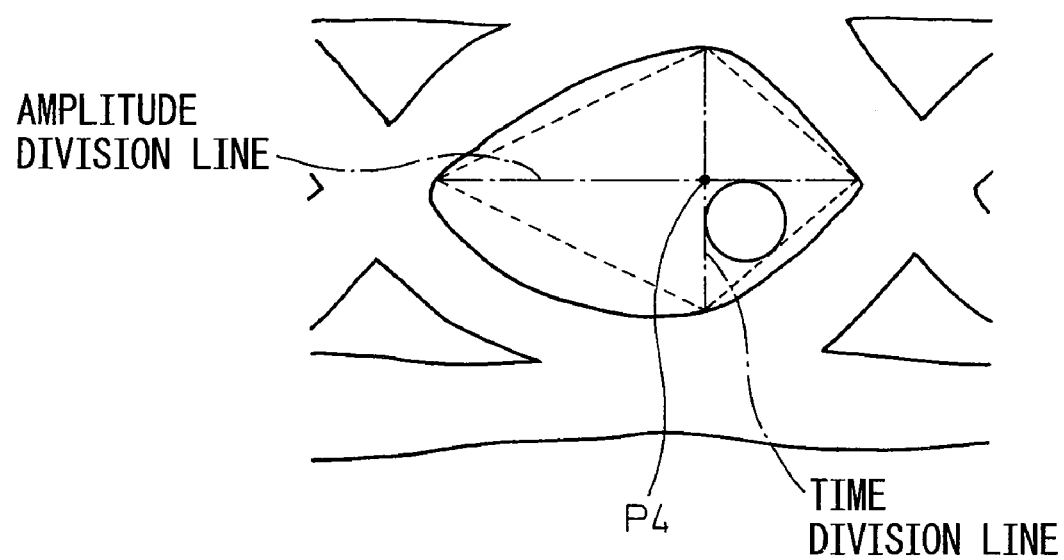

For example, FIGS. 13A and 13B illustrate an example in which the first embodiment of the invention is applied to an eye diagram. FIG. 13A illustrates an eye diagram that is obtained in receiving circuit 31 when receiving circuit 31 is directly connected with transmitting circuit 32 not via transmission path 5 as illustrated in FIG. 14, and then, signal transmitting circuit 6 transmits the predetermined signal to receiving circuit 31, wherein such signal corresponds to the input signal to the transmission path. A circle in the figure is the target virtual circle described above and the sampling point at this time is located at a point P3. Then, FIG. 13B illustrates an eye diagram of the signal output from the transmission path to which the above predetermined signal is input. At this time, "the largest virtual circle inscribed in the smallest divided region" is represented by a circle in the figure and the sampling point is located at a point P4. Pre-emphasis adjustment circuit 3 generates a pre-emphasis adjustment signal to allow the size of "the largest virtual circle inscribed in the smallest divided region" illustrated in FIG. 13B to conform to the size of the target virtual circle illustrated in FIG. 13A.

According to the second embodiment of the invention, because the accurate sampling point detected by the sampling point detection circuit according to the first aspect is used, the pre-emphasis intensity can be reliably and accurately adjusted.

The sampling point detection circuit according to the first embodiment of the invention can be used for purposes other than the pre-emphasis intensity adjustment method according to the second embodiment of the invention described above. For example, in a third embodiment of the present invention, a logic analyzer comprises the sampling point detection circuit according to the first embodiment of the invention described above.

According to the third embodiment of the invention, because the accurate sampling point detected by the sampling point detection circuit according to the first embodiment is used, reliable and accurate digital signal analysis of the logic analyzer can be implemented.

Further, a fourth embodiment of the invention is an evaluation method that uses the sampling point detection circuit according to the first embodiment of the invention described above for evaluating transmission characteristics of a transmission path based on an eye diagram of an output signal output from the output end of the transmission path when an evaluation signal is input to the input end of the transmission path. Thus, the sampling point detection circuit according to the first embodiment of the invention calculates the sampling point for the eye diagram of the output signal output from the output end of the transmission path and a parameter of the size of "the largest virtual circle inscribed in the smallest divided region" used for calculating such sampling point is used for evaluating the transmission characteristics of the transmission path. The parameter of the size of the virtual circle is a radius, diameter, area or circumferential length. The radius, diameter, area or circumferential length uniquely determines the size of the virtual circle.

The sampling point detection circuit according to the first embodiment of the invention calculates the size of "the largest virtual circle inscribed in the smallest divided region" described above by using the time division line and the amplitude division line that are related to values in the time axis direction affected by jitter and values in the amplitude axis direction affected by noise, respectively, and uses the "size" as the evaluation parameter. Consequently, the evaluation method according to the fourth embodiment of the invention using this sampling point detection circuit can evaluate the quality of the transmission path taking into consideration the effect of both the jitter and the noise.

For example, when the radius of the virtual circle is used as the parameter for evaluating the transmission characteristics of the transmission path, assuming that the radius of "the largest virtual circle inscribed in the smallest divided region" described above in the eye diagram of the evaluation signal input to the input end of the transmission path is R and the radius of "the largest virtual circle inscribed in the smallest divided region" described above in the eye diagram of the signal output from the output end of the transmission path is r, a signal degradation rate can be calculated as an equation (7):

$$\text{Signal degradation rate} = 1 - \frac{r}{R} \tag{7}$$

Figure 17:
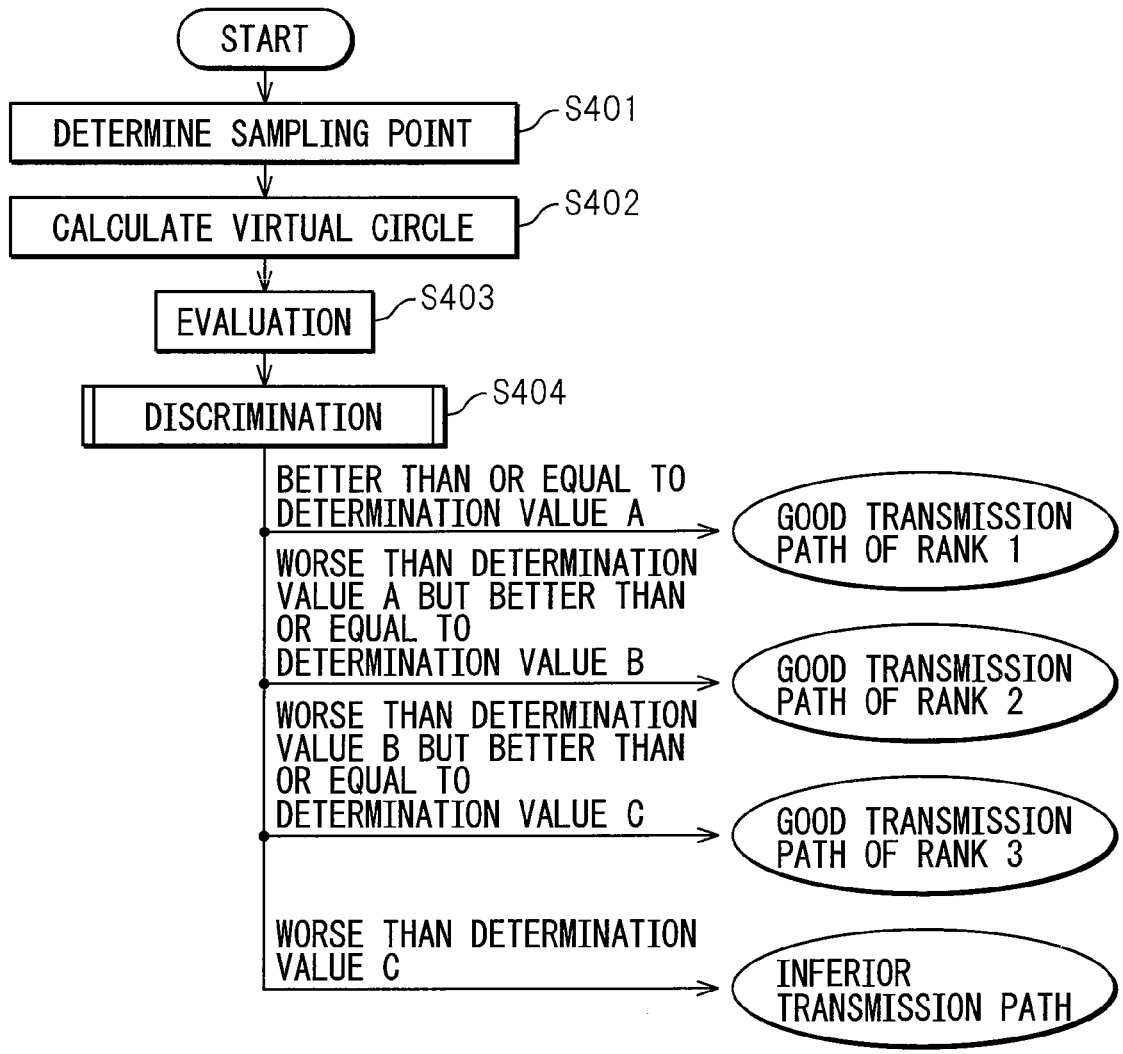
FIG. 17 is a flowchart illustrating a specific example of use of an evaluation method according to a fourth embodiment of the invention.

FIG. 17 is a flowchart illustrating a specific example of application of the evaluation method according to the fourth embodiment of the invention.

First, in step S401 in FIG. 17, the sampling point detection circuit according to the first embodiment of the invention determines the sampling point in the eye diagram of the evaluation signal input from the input end of the transmission path and the sampling point in the eye diagram of the signal output from the output end of the transmission path. In step S402, "the largest virtual circles inscribed in the respective smallest divided regions" corresponding to the sampling points described above are calculated.

In step S403, from the size of "the largest virtual circle inscribed in the smallest divided region" described above in the eye diagram of the evaluation signal input to the input end of the transmission path and the size of "the largest virtual circle inscribed in the smallest divided region" described above in the eye diagram of the signal output from the output end of the transmission path, the transmission characteristics of such transmission path are evaluated. For example, when the radius of the virtual circle is used as the parameter for evaluating the transmission characteristics of the transmission path, the transmission characteristics of such transmission path are quantified by using the equation (7) described above.

In step S404, based on the evaluation parameter quantified in step S403, such transmission path is ranked and discriminated. It is determined as follows: a determination value A discriminates between rank 1 and rank 2 of a good transmission path; a determination value B discriminates between rank 2 and rank 3 of a good transmission path; and a determination value C discriminates between a good transmission path and an inferior transmission path. In the discrimination process in step S404, the evaluation parameter quantified in step S403 can be automatically discriminated by the operation of the processor as follows: the value better than or equal to the determination value A corresponds to the good transmission path of the best rank 1; the value worse than the determination value A but better than or equal to the determination value B corresponds to the good transmission path of the next rank 2; the value worse than the determination value B but better than or equal to the determination value C corresponds to the good transmission path of the next rank 3; and the value worse than the determination value C corresponds to the inferior transmission path.

According to the fourth embodiment of the invention, the quality of the transmission path can be automatically evaluated by using the processor such as a computer. Further, the quality of the transmission path can be evaluated in a stepwise manner and discriminated in more detail. As a result, the transmission path can be inspected more precisely. Further, since the quality of the transmission path can be ranked, it is commercially advantageous that the transmission path can be priced as a commodity according to its quality.

Figure 18:
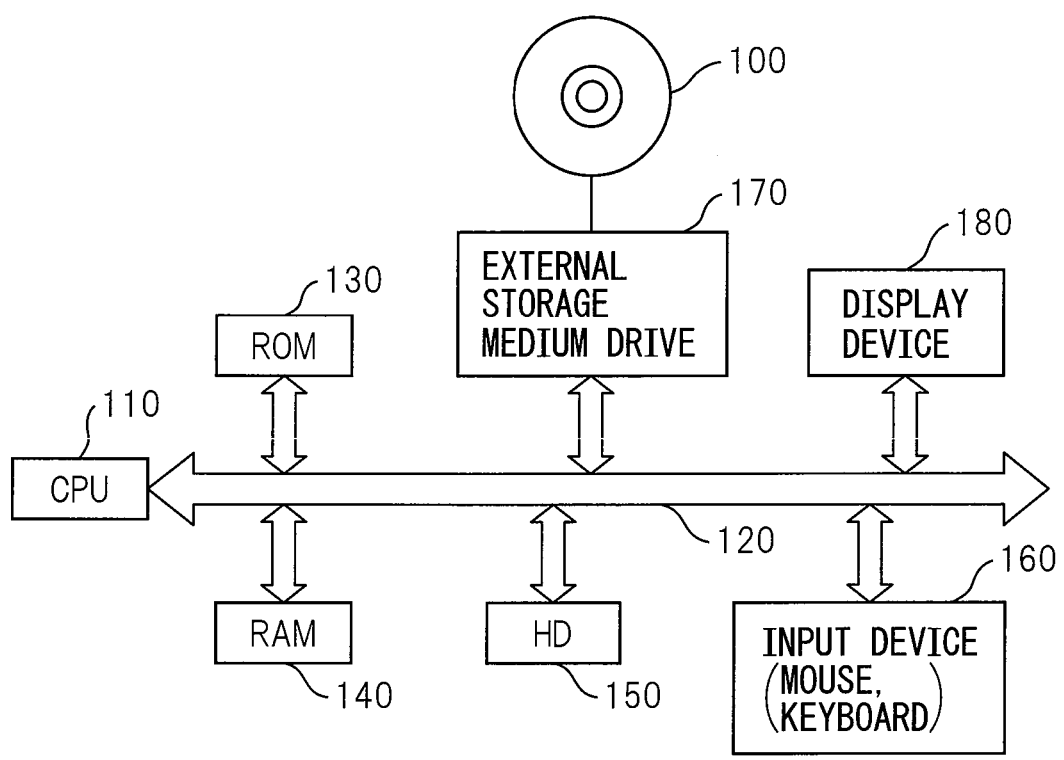
FIG. 18 is a block diagram illustrating a configuration of an apparatus implementing the sampling point detection circuit according to the first embodiment of the invention that operates according to a program stored on a recording medium.
Figure 19:
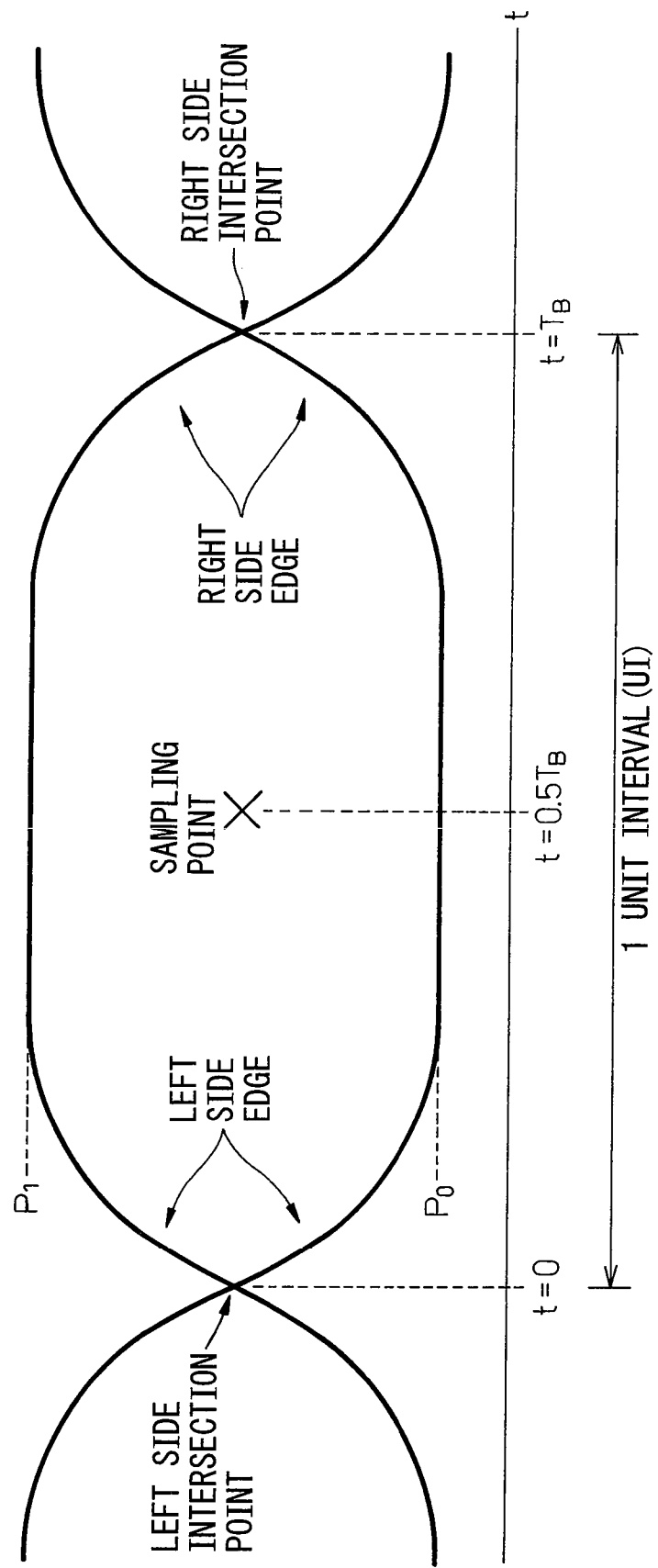
FIG. 19 is a diagram illustrating an eye pattern (eye diagram)
Figure 20:
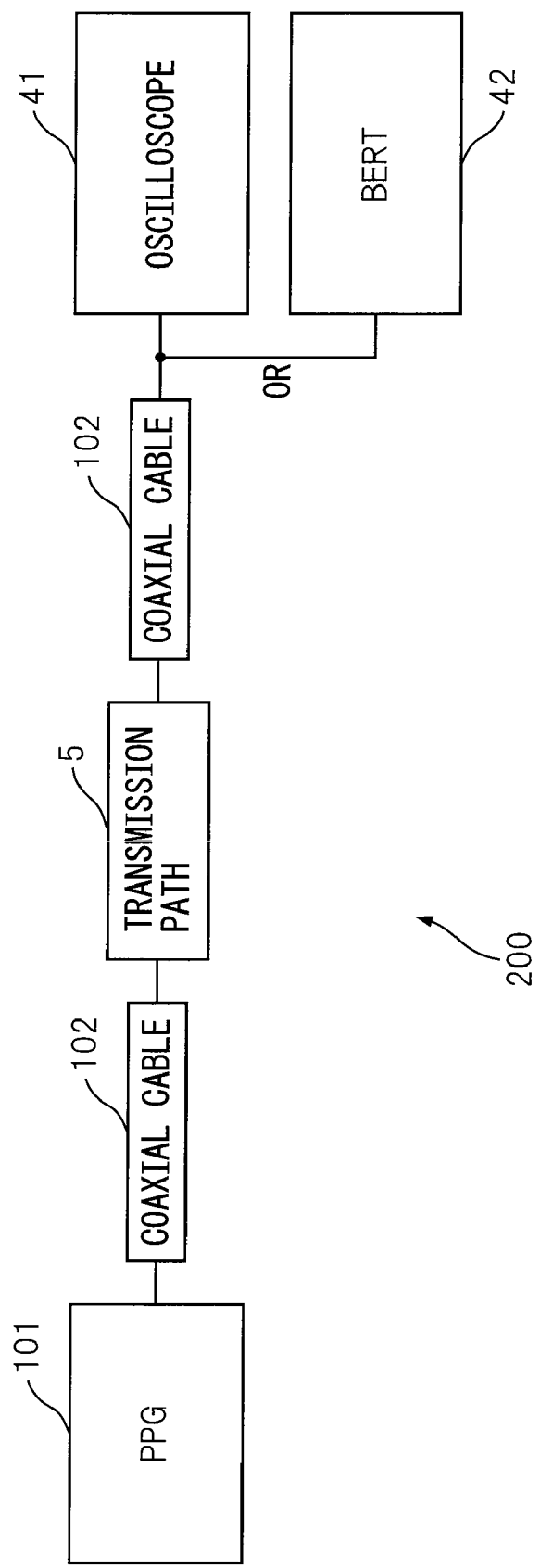
FIG. 20 is a diagram illustrating an evaluation system that is typically used in the conventional art.
Figure 21:
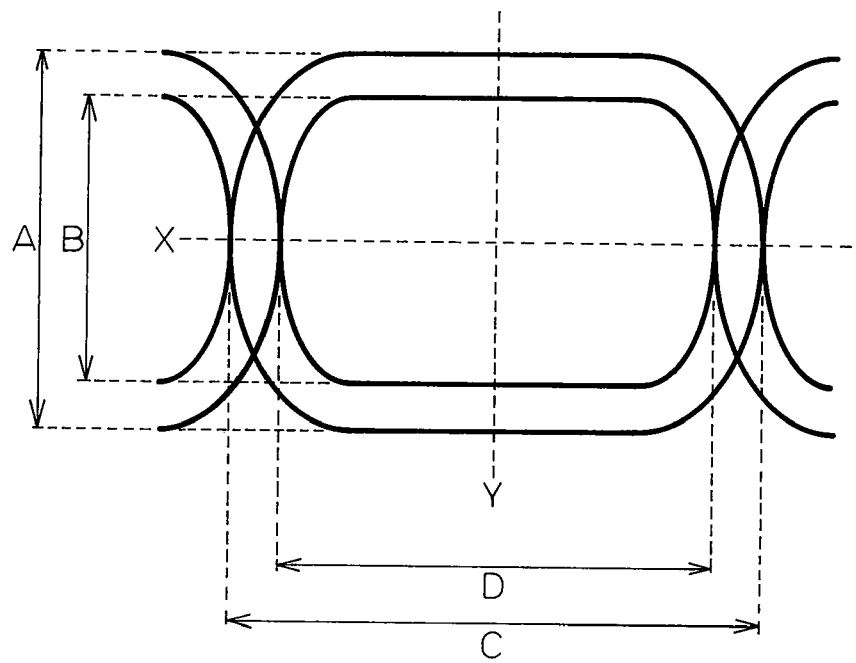
FIG. 21 is a diagram describing calculation of an eye opening ratio that is performed in the conventional art.
Figure 22:
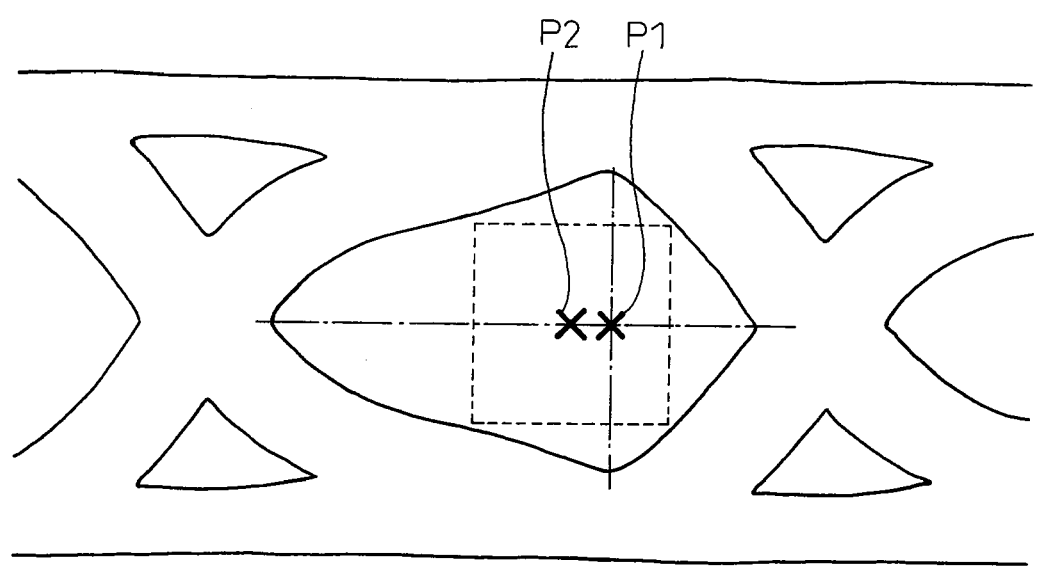
FIG. 22 is a diagram describing detection of a sampling point when an eye opening of an eye diagram has an asymmetrical shape in the time axis direction in an eye diagram.
Figure 23A:
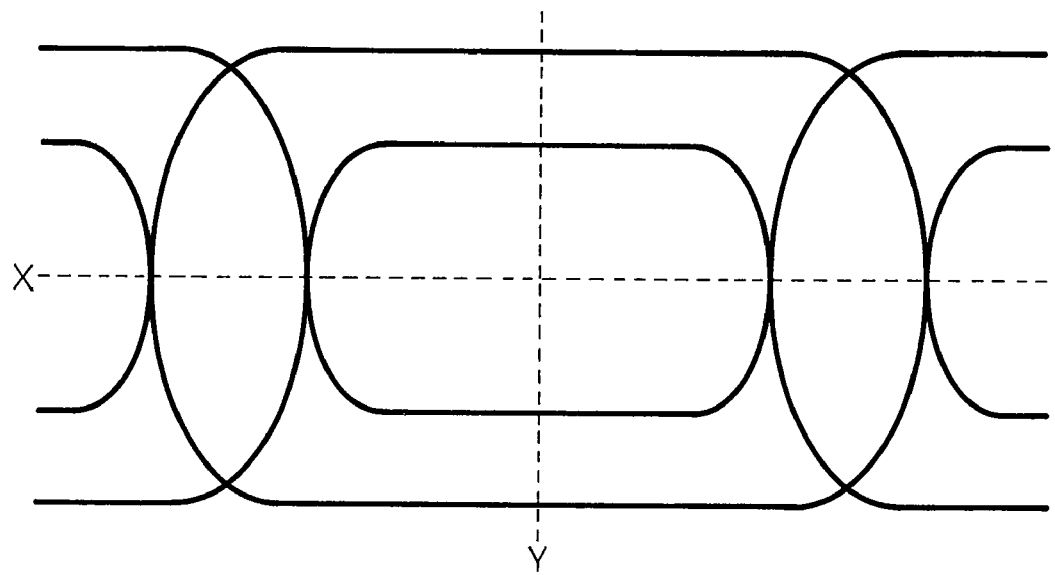
FIGS. 23A and 23B are diagrams describing evaluation of quality of a transmission path when an eye diagram is gently opened.
Figure 23B:
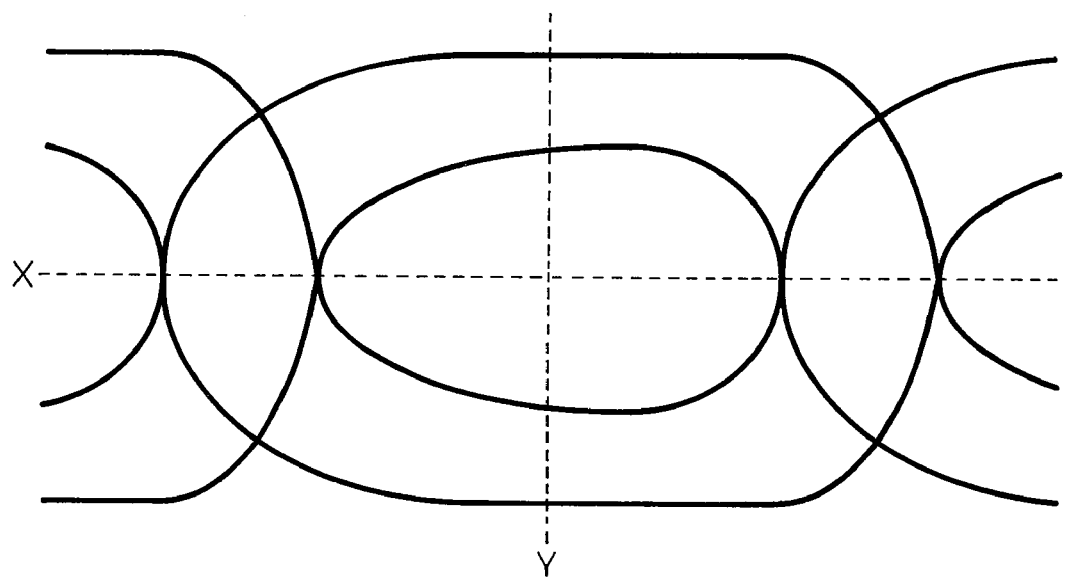

Sampling point detection circuit 1 according to the first embodiment of the invention illustrated in FIG. 1 is implemented by using a processor such as a computer and various measuring instruments. FIG. 18 is a block diagram illustrating a configuration of an apparatus implementing the sampling point detection circuit according to the first embodiment of the invention that operates according to a program that is stored on a storage medium.

As illustrated in FIG. 18, the software program for causing the computer to execute the operation of the sampling point detection circuit according to the first embodiment of the invention is stored on a storage medium (an external storage medium such as a flexible disk and a CD-ROM) 100 and, for example, it is installed in the computer configured as described below to operate as sampling point detection circuit 1 described above.

A CPU 110 controls sampling point detection circuit 1 entirely. This CPU 110 is connected with a ROM 130, a RAM 140, a HD (hard disk drive) 150, an input device 160 such as a mouse and a keyboard, an external storage medium drive 170, and a display device 180 such as a LCD, a CRT, a plasma display and an organic EL through a bus 120. A control program for CPU 110 is stored in ROM 130.

The software program for causing the computer to execute the operation of the sampling point detection circuit according to the first embodiment of the invention is installed (stored) from storage medium 100 on HD 150. Further, in RAM 140, a working area for CPU 110 to execute the processes for sampling point detection circuit 1 and an area for storing a portion of the program for executing such processes are secured. Moreover, in HD 150, input data, final data, and also an OS (operating system) and the like are stored in advance.

First, when the computer is turned on, CPU 110 reads the control program from ROM 130 and, further, reads the OS from HD 150 to start the OS. As a result, the computer is ready to install the program for executing the operation of sampling point detection circuit 1 from storage medium 100.

Next, storage medium 100 is mounted on external storage medium drive 170 and a control command is input from input device 160 to CPU 110 to read the program stored in storage medium 110 and store it in HD 150 and the like, and thus is installed on the computer.

After that, once the program is activated, the computer operates as sampling point detection circuit 1. The operator can execute the processes described above by manipulating input device 160 according to working details and procedures through an interaction indicated on display device 180. Data about the sampling points, virtual circles, amplitude division lines and time division lines obtained as a result of the processes may be, for example, stored on HD 150 for utilization in the future, or may be used to indicate the results of the process on display device 180 visually.

Although the program stored in storage medium 100 is installed on HD 150 in the computer of FIG. 18, the present invention is not limited to such implementation and the program may be installed on the computer through an information transmission medium such as a LAN and the like or the program may be installed in advance in HD 150 built in the computer.

The invention can be applied to evaluation of transmission characteristics of detection of a transmission signal on a transmission path that is used for high-speed serial transmission.

According to the first aspect of the invention, not only for the eye diagram whose eye opening shape is symmetrical in the amplitude and time axis directions but also even for the eye diagram whose eye opening shape is asymmetrical in the amplitude and/or time axis directions, the sampling point in the eye diagram can be detected quickly and accurately.

According to the second aspect of the invention, because the accurate sampling point detected by the sampling point detection circuit according to the first aspect is used, the pre-emphasis intensity can be reliably and accurately adjusted.

According to the third aspect of the invention, because the accurate sampling point detected by the sampling point detection circuit according to the first aspect is used, the reliable and accurate digital signal analysis can be implemented.

According to the fourth aspect of the invention, the quality of the transmission path can be automatically evaluated by using the processor such as the computer. Further, the quality of the transmission path can be evaluated in a stepwise manner and discriminated in more detail. As a result, the transmission path can be inspected more precisely. Further, since the quality of the transmission path can be ranked, it is commercially effective that the transmission path can be priced as a commodity according to its quality.

What is claimed is:

1. A sampling point detection circuit for detecting a sampling point in an eye diagram, comprising:
    division line setting means for successively setting amplitude division lines along a time axis and time division lines along an amplitude axis in a translational manner in said time and amplitude axis directions, respectively, on a virtual plane having coordinate axes that are said time and amplitude axes of an eye diagram;
    virtual circle calculation means for calculating a virtual circle that is inscribed in a divided region having the smallest area among four divided regions obtained when a region that is defined by segments each connecting intersections of a bit error rate contour line of an input eye diagram and said amplitude division line set by said division line setting means and intersections of said bit error rate contour line and said time division line set by said division line setting means and that contains an intersection of said amplitude division line and said time division line is divided by such amplitude division line and time division line; and sampling point determination means for determining, as a sampling point in the eye diagram in question, the intersection of said time division line and said amplitude division line that are set when the largest virtual circle is calculated among said virtual circles calculated by said virtual circle calculation means.

2. A sampling point detection circuit according to claim 1, wherein said virtual circle calculation means has smallest divided region determination means for determining, as said divided region having the smallest area, the divided area whose two sides are the shortest segment among two segments connecting the intersection of said time division line and said amplitude division line and the intersections of said time division line and said bit error rate contour line and the shortest segment among two segments connecting the intersection of said time division line and said amplitude division line and the intersections of said amplitude division line and said bit error rate contour line, among said four divided regions.

3. A sampling point detection circuit according to claim 1, wherein said virtual circle calculation means has:

first means for calculating the largest virtual circle among a plurality of said virtual circles calculated by using said amplitude division line that is set at the position where the distance between the intersections of said amplitude division line and said bit error rate contour line has the largest value and said time division lines that are successively set in a translational manner in said time axis direction;

second means for performing a determination process for determining on which side said largest virtual circle calculated by said first means exists in said amplitude axis direction with regard to such amplitude division line that is set at the position where the distance between the intersections of said amplitude division line and said bit error rate contour line has the largest value;

third means for performing a calculation process for calculating the largest virtual circle among said virtual circles calculated by using an amplitude division line that is newly set at a position opposite to the side where said largest virtual circle determined by said second means exists with respect to said previous amplitude division line and said time division lines that are successively set in a translational manner in said time axis direction; and fourth means for performing a determination process for determining whether said largest virtual circle calculated by said third means and said largest virtual circle calculated by said first means are located at the same side in said amplitude axis direction with respect to said amplitude division line that is set at the position where the distance between the intersections of said amplitude division line and said bit error rate contour line has the largest value or not, wherein said calculation process by said third means and said determination process by said fourth means are performed repeatedly till said fourth means determines that said largest virtual circle calculated by said third means and said largest virtual circle calculated by said first means are not located at the same side in said amplitude axis direction with respect to said amplitude division line that is set at the position where the distance between the intersections of said amplitude division line and said bit error rate contour line has the largest value.

4. A sampling point detection circuit according to claim 3, wherein, till said fourth means determines that said largest virtual circle calculated by said third means and said largest virtual circle calculated by said first means are not located at the same side in said amplitude axis direction with respect to said amplitude division line that is set at the position where the distance between the intersections of said amplitude division line and said bit error rate contour line has the largest value, said division line setting means newly sets the amplitude division line at the position opposite to the side where said largest virtual circle determined by said second means exists with respect to said amplitude division line that is set at the position where the distance between the intersections of said amplitude division line and said bit error rate contour line has the largest value, and successively sets a plurality of the time division lines in a translational manner in said time axis direction with respect to said one newly set amplitude division line.

5. A sampling point detection circuit according to claim 3, wherein said first means stores, in storage means, information about a size of said calculated largest virtual circle and information about a position of said time division line when such largest virtual circle is calculated, said second means stores, in the storage means, information about the determination result on which side said largest virtual circle calculated by said first means exists in said amplitude axis direction with respect to such amplitude division line that is set at the position where the distance between the intersections of said amplitude division line and said bit error rate contour line has the largest value, said third means stores, in the storage means, information about a size of said calculated largest virtual circle and information about the positions of said amplitude division line and said time division line when such largest virtual circle is calculated, and said fourth means stores, in the storage means, information about the determination result on whether said largest virtual circle calculated by said third means and said largest virtual circle calculated by said first means are located at the same side in said amplitude axis direction with respect to said amplitude division line that is set at the position where the distance between the intersections of said amplitude division line and said bit error rate contour line has the largest value.

6. A sampling point detection circuit according to claim 1, wherein the size of said virtual circle is determined by a parameter such as a radius, diameter, area or circumferential length.

7. A sampling point detection circuit according to claim 1, wherein a bit error rate contour line calculation circuit for calculating the bit error contour line for the signal to be measured and inputting it to said virtual circle calculation means is connected thereto.

8. A transmission system comprising:

the sampling point detection circuit according to claim 1;

a memory for storing, as a size of a target virtual circle, the size of said virtual circle corresponding to the sampling point determined by said sampling point detection circuit by using a bit error rate contour line for a predetermined signal; and a pre-emphasis adjustment circuit for adjusting pre-emphasis intensity of a signal transmitting circuit that transmits a signal input to an input end of a transmission path so that the size of said virtual circle corresponding to the sampling point determined by said sampling point detection circuit by using a bit error rate contour line for a signal output from an output end of said transmission path when said predetermined signal is input to the input end of said transmission path conforms to the size of said target virtual circle stored in said memory.

9. A pre-emphasis intensity adjustment method comprising the steps of:
using the sampling point detection circuit according to claim 1 to store, in a memory, as a size of a target virtual circle, the size of said virtual circle corresponding to the sampling point determined by said sampling point detection circuit by using a bit error rate contour line for a predetermined signal; and
adjusting pre-emphasis intensity of a signal transmitting circuit that transmits a signal input to an input end of a transmission path so that the size of said virtual circle corresponding to the sampling point determined by said sampling point detection circuit by using a bit error rate contour line for a signal output from an output end of said transmission path when said predetermined signal is input to the input end of said transmission path conforms to the size of said target virtual circle stored in said memory.

10. A logic analyzer comprising the sampling point detection circuit according to claim 7.

11. An evaluation method for evaluating transmission characteristics of a transmission path based on an eye diagram of an output signal output from an output end of said transmission path when an evaluation signal is input to an input end of said transmission path, the method comprising the steps of:
successively setting, by a processor, amplitude division lines along a time axis and time division lines along an amplitude axis in a translational manner in said time and amplitude axis directions, respectively, on a virtual plane having coordinate axes that are said time and amplitude axes of the eye diagram;

calculating, by the processor, a virtual circle that is inscribed in a divided region having the smallest area among four divided regions obtained when a region that is defined by segments each connecting intersections of a bit error rate contour line of an input eye diagram and said amplitude division line set in said division line setting step and intersections of said bit error rate contour line and said time division line set in said division line setting step and that contains an intersection of said amplitude division line and said time division line is divided by such amplitude division line and time division line; and
evaluating, by the processor, quality of said transmission path based on a parameter determining the size of said virtual circle calculated by said virtual circle calculation step.

12. An evaluation method according to claim 11, wherein said virtual circle calculation step comprising the step of:
determining, by the processor, as said divided region having the smallest area, the divided area whose two sides are the shortest segment among two segments connecting the intersection of said time division line and said amplitude division line and the intersections of said time division line and said bit error rate contour line and the shortest segment among two segments connecting the intersection of said time division line and said amplitude division line and the intersections of said amplitude division line and said bit error rate contour line, among said four divided regions.

13. An evaluation method according to claim 11, wherein the size of said virtual circle is determined by a parameter such as a radius, diameter, area or circumferential length.

14. An evaluation method according to claim 11, further comprising the step of calculating the bit error rate contour line for the signal to be measured and treating as the input in said virtual circle calculation step.

* * * * *